(12) United States Patent
Shimizu et al.

(10) Patent No.: US 7,616,438 B2
(45) Date of Patent: Nov. 10, 2009

(54) ELECTRIC CONNECTION BOX

(75) Inventors: Tatsuya Shimizu, Yokkaichi (JP);
Manabu Hashikura, Yokkaichi (JP);
Futoshi Nishida, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 199 days.

(21) Appl. No.: 11/984,083

(22) Filed: Nov. 13, 2007

(65) Prior Publication Data
US 2008/0119066 A1 May 22, 2008

(30) Foreign Application Priority Data

Nov. 21, 2006 (JP) ............................. 2006-313922
Mar. 15, 2007 (JP) ............................. 2007-067244

(51) Int. Cl.
*H05K 7/20* (2006.01)
(52) U.S. Cl. ..................................................... 361/694
(58) Field of Classification Search ................. 361/694, 361/695, 679.46, 679.49; 439/487; 174/50, 174/15.1, 52.4; 165/104.33
See application file for complete search history.

(56) References Cited

U.S. PATENT DOCUMENTS

| 5,474,475 | A * | 12/1995 | Yamaguchi | 439/620.27 |
| 7,248,472 | B2 * | 7/2007 | Vinson et al. | 361/694 |
| 7,349,208 | B2 * | 3/2008 | Marumoto | 361/690 |
| 7,450,377 | B2 * | 11/2008 | Matsumoto et al. | 361/679.48 |
| 2004/0159455 | A1 * | 8/2004 | Onizuka et al. | 174/50 |
| 2007/0281506 | A1 * | 12/2007 | Wang et al. | 439/70 |

FOREIGN PATENT DOCUMENTS

| JP | 9-214158 A | 8/1997 |
| JP | 2000-36679 A | 2/2000 |
| JP | 2001-197628 A | 7/2001 |
| JP | 2001-298290 A | 10/2001 |
| JP | 2005-295724 A | 10/2005 |
| JP | 2006-19711 A | 1/2006 |

OTHER PUBLICATIONS

Ishikura, M., "A Thermal Design Approach for Natural Air Cooled Electronic Equipment Casings," *1995 National Heat Transfer Conference*-vol. 1, HTD-vol. 303, pp. 65-72 (1995).
U.S. Appl. No. 11/984,084, filed Nov. 13, 2007 in the name of Manabu Hashikura.
U.S. Appl. No. 11/984,086, filed Nov. 13, 2007 in the name of Tatsuya Shimizu et al.

* cited by examiner

*Primary Examiner*—Chandrika Prasad
(74) *Attorney, Agent, or Firm*—Oliff & Berridge, PLC

(57) ABSTRACT

An electric connection box according to one aspect of the present invention can include conductive members on a circuit board, a case accommodating the circuit board, a ventilation path formed in the case and through which air can flow in a vertical direction, a suction port formed in the case to be in communication with the ventilation path, an exhaust port formed in the case to be in communication with the ventilation path, the exhaust port positioned above the suction port, cooled portions positioned on the conductive members and positioned in the ventilation path so as to allow air to flow in the vertical direction between conductive members, and heat generating components connected to the cooled portions of the conductive members.

18 Claims, 23 Drawing Sheets

ELECTRIC CONNECTION BOX

CROSS REFERENCE TO RELATED APPLICATION

This application claims priority from Japanese Patent Application No. 2006-313922 filed on Nov. 21, 2006 and Application No. 2007-067244 filed on Mar. 15, 2007. The entire content of these priority applications is incorporated herein by reference.

TECHNICAL FIELD

The disclosure relates to an electric connection box comprising a circuit board accommodated in a case.

BACKGROUND

An electric connection box described in Patent Document 1 (Japanese Unexamined Patent Application Publication No. 2005-295724) is conventionally known. The electric connection box comprises a case accommodating a relay module having a relay mounted on a circuit board. When current is passed through the relay, the relay generates heat. The heat is dissipated into the case and then to the exterior through a window of the case.

In recent years, an increase in density has been demanded for electric connection boxes. This has resulted in a tendency to increase the number of relays accommodated in a case and thus the total quantity of heat generated by the relays. A size reduction has also been demanded for the electric connection boxes. The volume of the case thus tends to decrease. Thus, the heat generated by the relays may remain in the case, which may become hot. The increased temperature of the interior of the case may degrade the performance of electronic components mounted on a circuit board.

It is thus possible to form a suction port and an exhaust port in a case so that air can flow through the case, to cool the case by air. However, this technique cannot inhibit the relays from becoming locally hot. The reason is as follows. When current is passed through the relay, components of the relay such as a coil which are accommodated in a housing for the relay generate heat. In particular, the vicinity of the bottom of the housing where the relay components are arranged is likely to become hot. Thus, even when the housing for the relay is entirely cooled by air, air is prevented from flowing through the area between the bottom of the relay and the circuit board. This makes it difficult to inhibit the bottom of the relay from becoming locally hot. If the relay is mounted on the circuit board, heat is prevented from being transmitted to the circuit board made of a synthetic resin, which has a relatively low thermal conductivity, causing more heat to remain at the bottom of the relay.

It is thus possible to dispose a bus bar on the circuit board and to connect the bus bar to the relay so that heat generated by the components of the relay can be transmitted to the bus bar, which is then cooled by air. However, even with this technique, the air contacts only the surface of the bus bar, preventing heat from being efficiently transmitted from the bus bar to the air. This makes it difficult to sufficiently cool the relay.

SUMMARY

The present invention has been completed on the basis of these circumstances. An object of the present invention is to inhibit heat generating components accommodated in an electric connection box from becoming locally hot.

An electric connection box according to one aspect of the present invention can include conductive members on a circuit board, a case accommodating the circuit board, a ventilation path formed in the case and through which air can flow in a vertical direction, a suction port formed in the case to be in communication with the ventilation path, an exhaust port formed in the case to be in communication with the ventilation path, the exhaust port positioned above the suction port, cooled portions positioned on the conductive members and positioned in the ventilation path so as to allow air to flow in the vertical direction between conductive members, and heat generating components connected to the cooled portions of the conductive members.

According to the present invention, air can flow between the cooled portions of the conductive members, positioned in the ventilation path. Thus, the air having passed between the cooled portions flows through the area between the cooled portion of each of the conductive members and the heat generating component connected to the cooled portion. This enables the area of the heat generating component which is positioned closer to the conductive material to be efficiently cooled by air. The heat generating component can thus be inhibited from becoming locally hot.

BRIEF DESCRIPTION OF THE DRAWINGS

Illustrative aspects in accordance with the invention will be described in detail with reference to the following figures wherein.

DETAILED DESCRIPTION OF THE PREFERRED ILLUSTRATIVE ASPECTS

Illustrative Aspect 1 of the present invention will be described with reference to FIGS. 1 to 7. An electric connection box in accordance with the present illustrative aspect is mounted between a battery (not shown) and an on-vehicle electric component (not shown) such as a lamp or a power window to controllably turn on and off a power supply to the on-vehicle electric component. The electric connection box is mounted in the interior of an automobile (not shown) in a vertical condition shown in FIG. 6. The electric connection box has a circuit board 11 accommodated in a flat case 10.

(Circuit Board)

Figure 7:
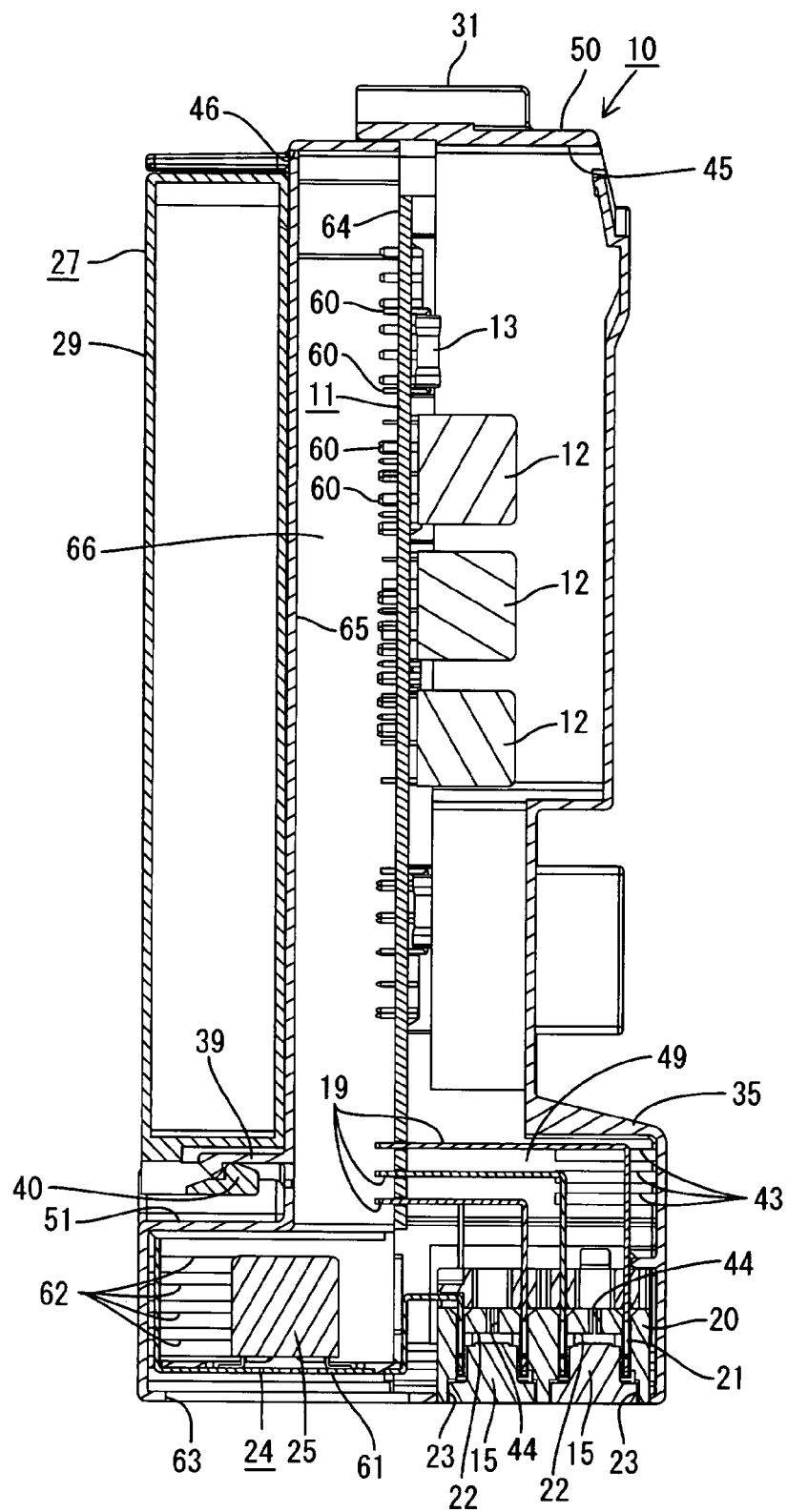
FIG. 7 is a sectional view taken along line B-B in FIG. 3.

The circuit board 11 is a substantially rectangular and has a conductive path (not shown) formed on the opposite surfaces thereof by a print wiring technique. The circuit board 11 has intermittent relays 12 (corresponding to electronic components in accordance with the present invention) which are mounted on a right surface thereof in FIG. 7 (hereinafter referred to as a mounting surface) and which turn on and off the power supply to an on-vehicle electric component (not shown) such as a fog lamp or a door lock which is intermittently used. A resistor 13 (corresponding to an electronic component in accordance with the present invention) is mounted on the mounting surface of the circuit board 11 to prevent a counter electromotive force from being exerted by the intermittent relays 12. Thus, a left surface of the circuit board 11 in FIG. 7 is used as a non-mounting surface 64. The circuit board 11 further has a male tab 17 (male terminal) mounted on the mounting surface via a male tab pedestal 18 and connected to a connector 14 for connection to an external circuit.

The intermittent relays 12 and lead terminals 60 of the resistor 13 penetrate the circuit board 11 from the mounting surface to the non-mounting surface 64. The lead terminals 60 are formed on the circuit board 11 and soldered to through-holes (not shown) electrically connected to a conductive path. The tip of each of the lead terminals 60 projects from the non-mounting surface 64 of the circuit board 11.

Figure 6:
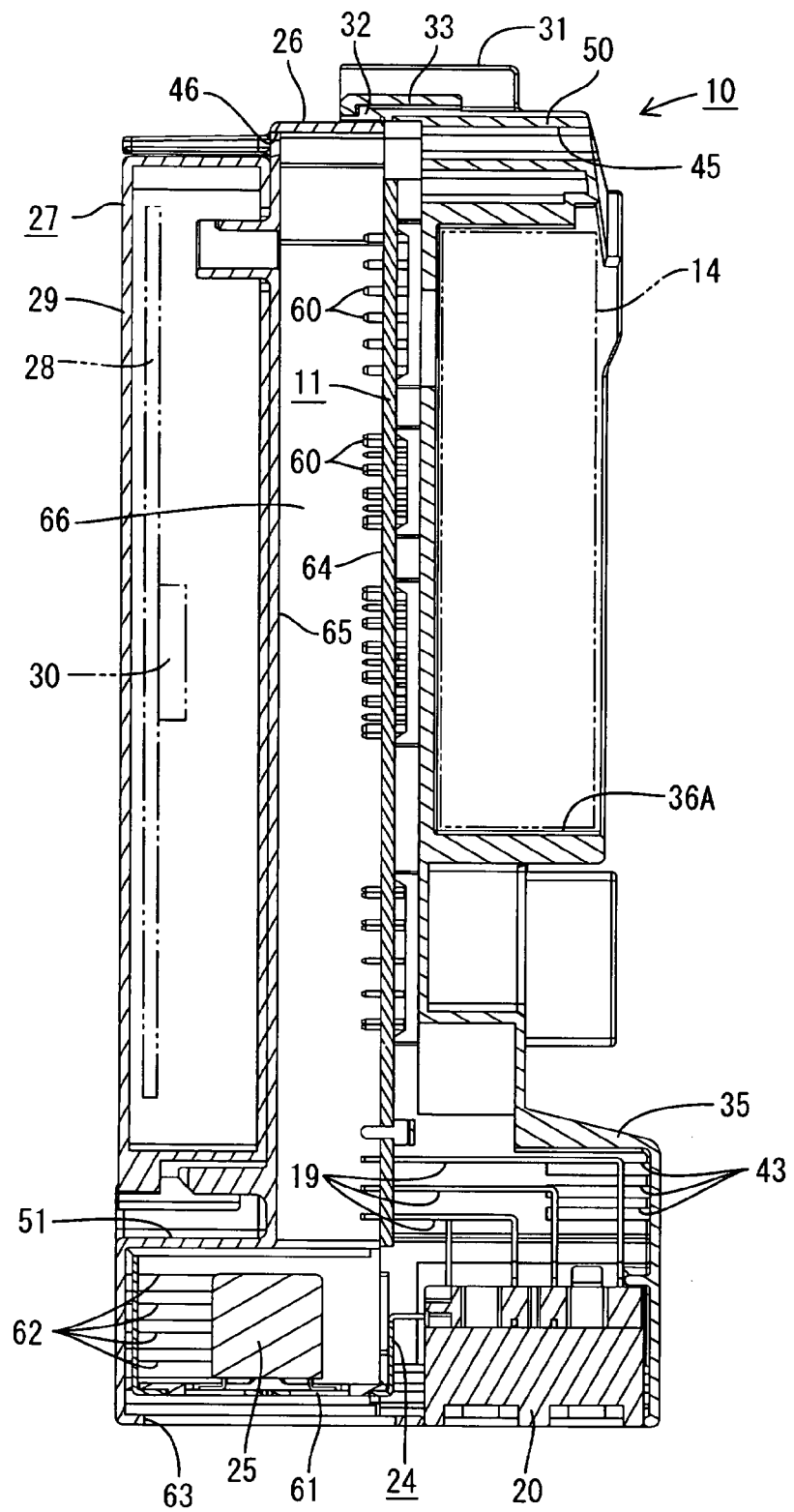
FIG. 6 is a sectional view taken along line A-A in FIG. 3.

As shown in FIGS. 6 and 7, at a lower end of the circuit board 11, one end of each of a plurality of terminal fittings 19 penetrates the circuit board 11 and is formed on the circuit board 11 and soldered to a through-hole electrically connected to the conductive path. The other end of the terminal fitting 19 is folded downward into a substantial L shape and installed in a fuse block 20. The other ends of the terminal fittings 19 constitute fuse terminals 21 between which fuses 15 are installed.

Figure 4:
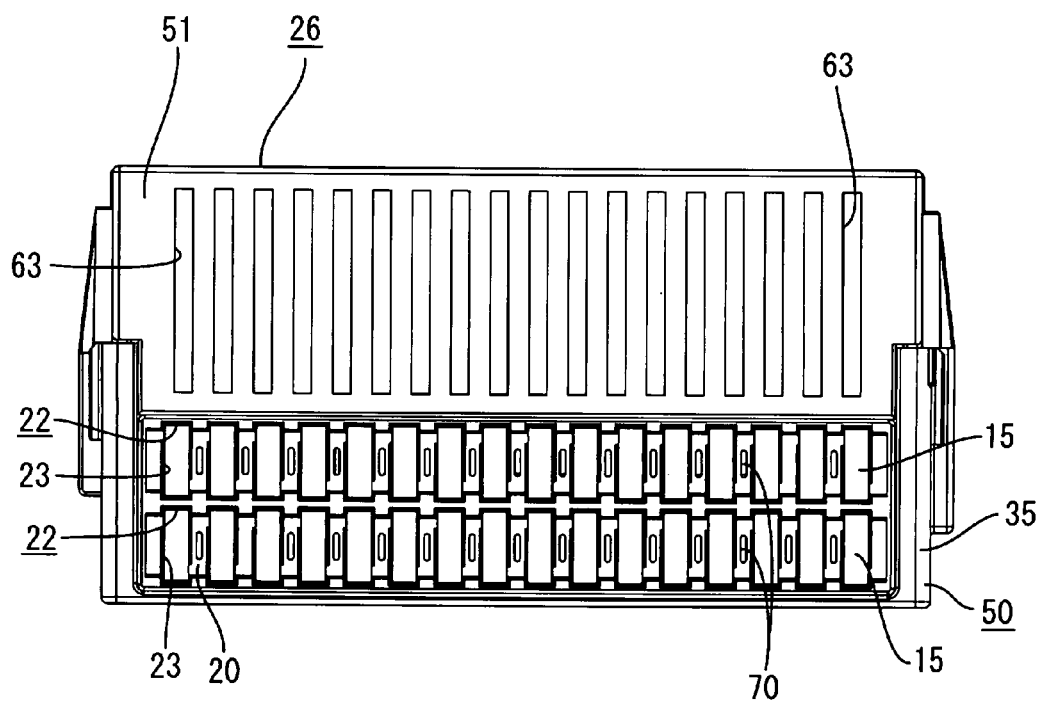
FIG. 4 is a bottom view of the electric connection box.

As shown in FIG. 6, the fuse block 20 is made of a synthetic resin and is substantially rectangular. The fuse block 20 has fuse installing portions 22 formed on a bottom surface thereof so as to be depressed upward in FIG. 7 to allow the fuses 15 to be installed therein. The fuse block 20 also has openings 23 formed therein so as to open downward. The fuse terminal 21 of each of the terminal fittings 19 is located in the corresponding fuse installing portion 22. As shown in FIG. 4, the fuse installing portions 22 are arranged in both the lateral and vertical directions of FIG. 4 (in the present illustrative aspect, the fuse installing portions 22 are arranged in two vertical stages). The fuse installing portion 22 has a through-hole 44 formed in an upper wall thereof to allow outside air to flow from the fuse installing portion 22 into a fuse accommodating portion 35 described below through the through-hole 44. This enables the fuses 15 to be cooled. The fuse block 20 also has ventilation holes 70 each formed between the adjacent fuse installing portions 22 so as to penetrate a bottom wall of the fuse block 20. The ventilation hole allows an internal space in the fuse accommodating portion 35 to communicate with an external space. The outside air can flow into the case 10 through the ventilation holes 70. This makes it possible to improve the heat dissipation of the electric connection box.

Although not shown in detail, a relay terminal (not shown) is mounted on the non-mounting surface 64 at an upper edge of the circuit board 11 and connected to an ECU 27 described below.

(Case)

Figure 1:
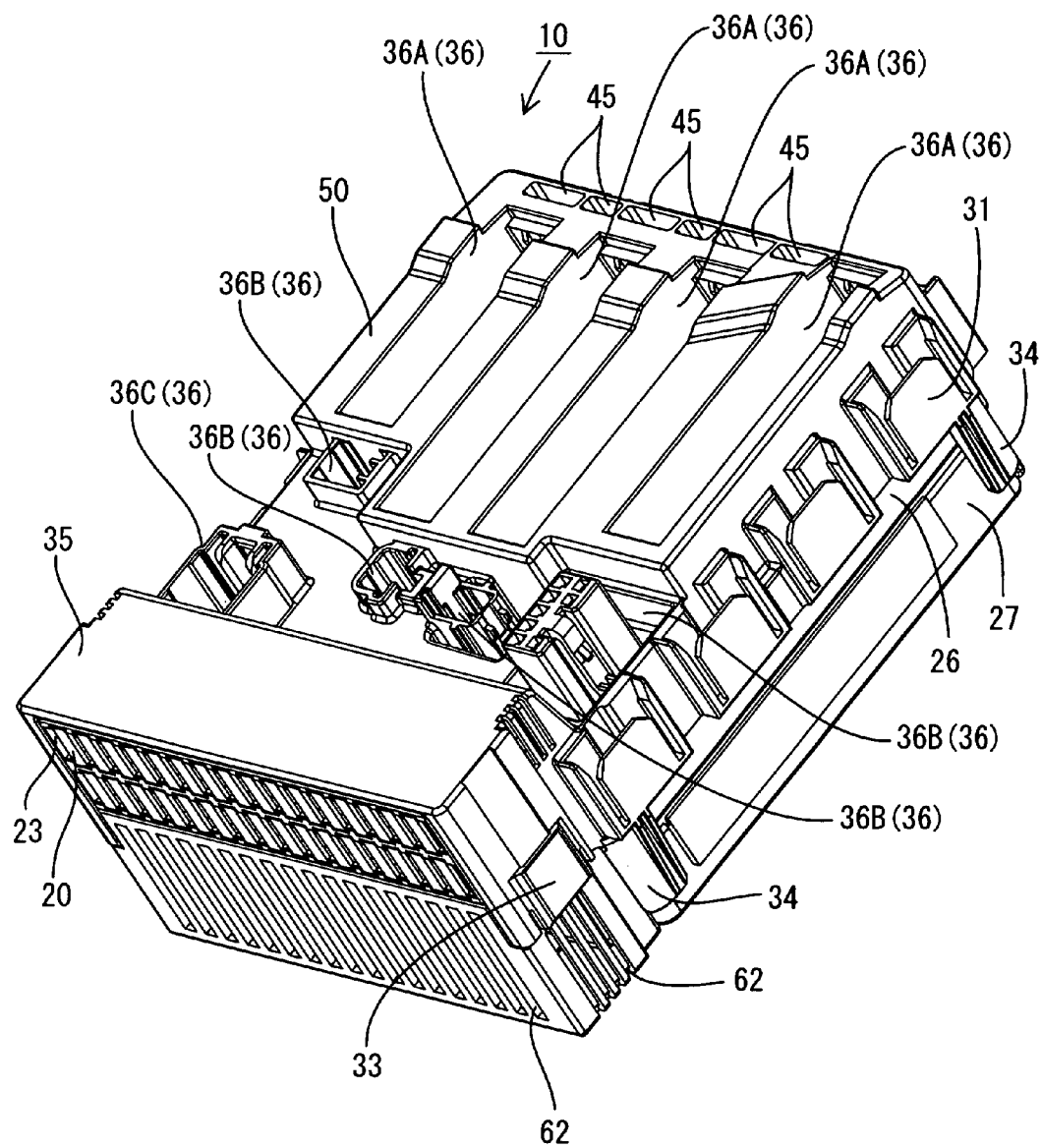
FIG. 1 is a perspective view of an electric connection box in accordance with Illustrative Aspect 1 of the present invention.
Figure 2:
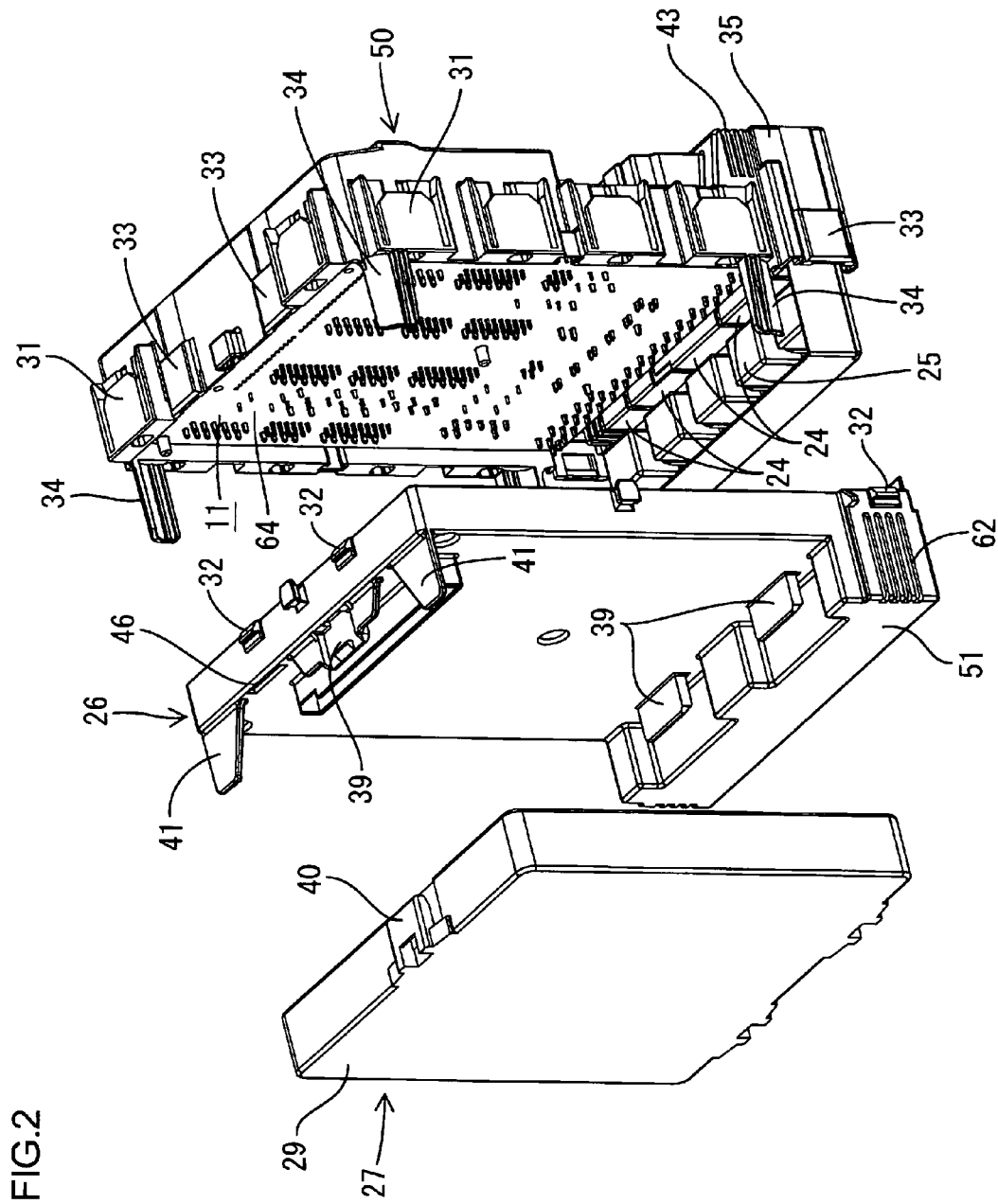
FIG. 2 is an exploded perspective view of the electric connection box.

As shown in FIG. 2, the case 10 is made of a synthetic resin and comprises a flat case main body 50 that accommodates the circuit board 11 and a cover 26 that covers an open surface of the case main body 50. The cover 26 has the ECU 27 mounted on a surface thereof located opposite the case main body 50.

The ECU 27 has an ECU circuit board 28 (shown by an alternate long and two short dashes line in FIG. 6) accommodated in an ECU case 29. The ECU circuit board 28 has a microcomputer 30 (shown by an alternate long and two short dashes line in FIG. 6) mounted thereon and a driving circuit for the intermittent relays 12 and the like formed thereon. The ECU circuit board 28 and the circuit board 11 are connected together by the relay terminal penetrating the cover 26 and the ECU case 29.

The case main body 50 is shaped like a shallow container and accommodates the circuit board 11. Car body locks 31 are provided on outer side surfaces of side walls of the case main body 50 to mount the electric connection box in the car body of the automobile. Lock receivers 33 are provided on a top surface and side surfaces of the case main body 50 in FIG. 2 and elastically engage lock projections 32 provided on a top surface and side surfaces of the cover 26. The lock receivers 33 engage the lock projections 32 to integrate the case main body 50 with the cover 26.

A lower end of the case main body 50 bulges rightward in FIG. 6 to constitute the fuse accommodating portion 35, which accommodates the fuse block 20 as described above. A lower end of the fuse accommodating portion 35 opens downward so as to form an opening 23 in which the fuse block 20 is installed. As shown in FIG. 6, a lower opening edge of the fuse accommodating portion 35 is substantially flush with outer side surfaces of the bottom of the fuse block 20.

A connector fitting portion 36 in which the connector 14 is installed is formed in a right side wall of the case main body 50 in FIG. 6 so as to be depressed toward the circuit board 11 (to the left in FIG. 6).

Figure 3:
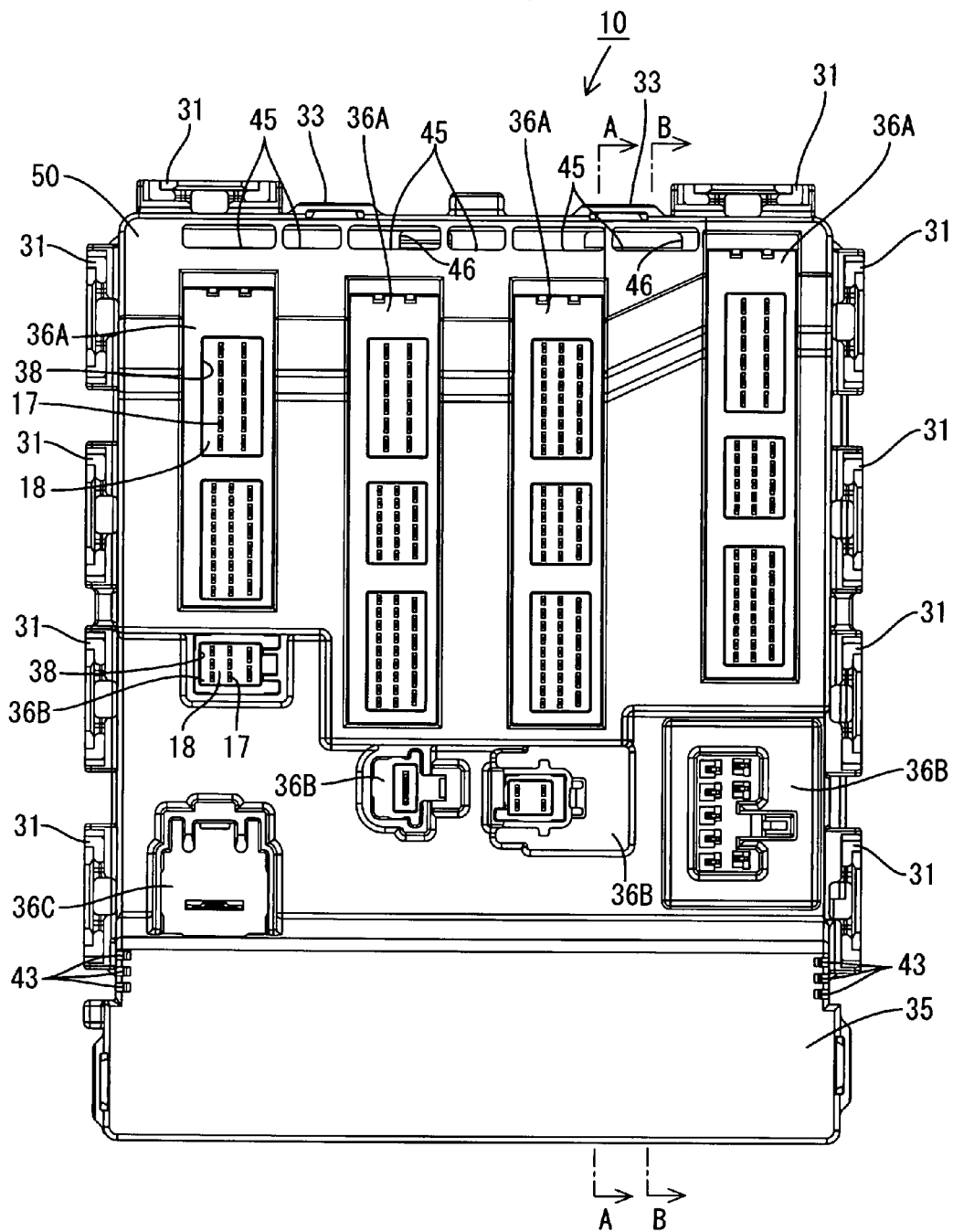
FIG. 3 is a front view of the electric connection box.

As shown in FIG. 3, a plurality of (in the illustrative aspect, four) upper connector fitting portions 36A formed on an upper side of the case main body 50 are extended in the vertical direction and arranged at intervals in the lateral direction of FIG. 3. Below the upper connector fitting portions 36A, a plurality of (in the illustrative aspect, four) lower connector fitting portions 36B are formed at intervals in the lateral direction of FIG. 3. A power source connector fitting portion 36C connected to a power source line (not shown) to a battery is formed below the lower connector fitting portion 36B positioned at the left end in FIG. 3. As shown in FIG. 3, a window 38 is formed in an inner wall of each of the upper and lower connector fitting portions 36A and 36B. The male tabs 17 and male tab pedestals 18, described above, lie opposite the upper and lower fitting portions 36A and 36B across the windows 38. The male tabs 17 project from an inner wall of the power source connector fitting portion 36C.

Figure 5:
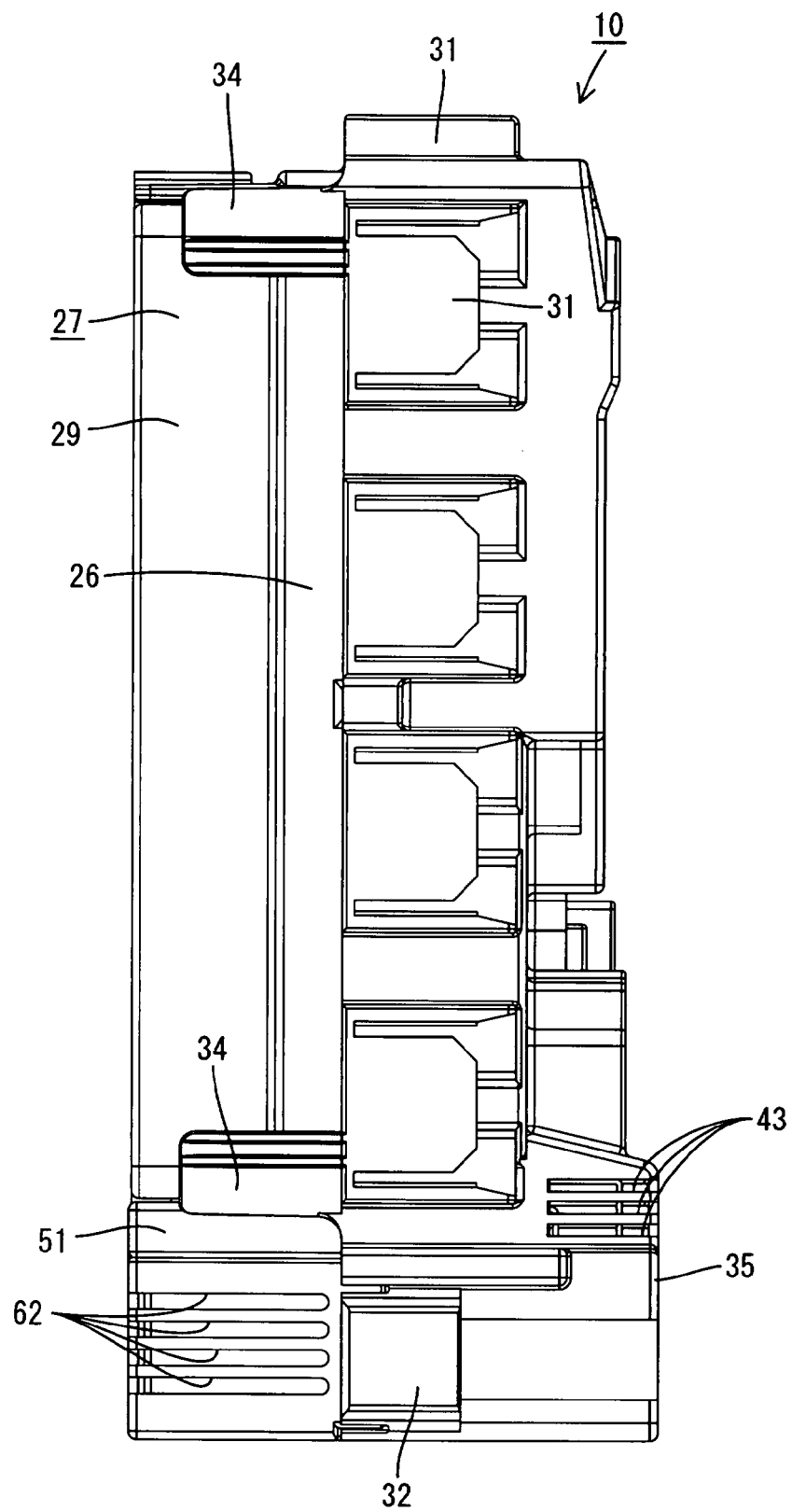
FIG. 5 is a side view of the electric connection box.

As shown in FIG. 5, ventilation ports 43 are formed in an upper part of the fuse accommodating portion 35 of the case main body 50 so as to extend in the lateral direction of FIG. 5. The ventilation ports 43 allow the outside air to flow into the case 10.

As shown in FIG. 2, the cover 26 is shaped like a shallow plate and mounted so as to close the open surface of the case main body 50. As shown in FIG. 2, the lock projections 32 that engage the lock receivers 33 of the case main body 50 are formed on the upper wall and side walls of the cover 26. The cover 26 has locks 39 formed on a wall surface thereof located opposite the ECU 27; the locks 39 project toward the ECU 27 and are elastically flexible. The locks 39 elastically engage lock receivers 40 formed on the ECU 27 to integrate the cover 26 with the ECU 27.

As shown in FIG. 2, a plate-like guide 41 projecting toward the ECU 27 is formed on a surface of the cover 26 located opposite the ECU 27. When the cover 26 and the ECU 27 are assembled together, the guide 41 slidably contacts an outer side surface of the ECU case 29 of the ECU 27 to guide the ECU 27 to a regular assembly position. Moreover, four guides 34 extending toward the cover 26 are provided in the respective corners of the open surface of the case main body 50. When the case main body 50, the cover 26, and the ECU 27 are assembled together, outer side surfaces of the cover 26 and ECU 27 which are located at positions corresponding to the guides 34 slidably contact inner side surfaces of the guides 34. This allows the cover 26 and the ECU 27 to be guided to a regular assembly position. The assembly of the ECU 27 may be carried out after the case main body 50 and the cover 26 are assembled together.

As shown in FIG. 6, a lower end of the cover 26 bulges leftward in FIG. 6 so as to constitute a relay accommodating portion 51 that accommodates relays 25 described above. As shown in FIG. 6, outer side surfaces of a bottom wall of the relay accommodating portion 51 are flush with outer side surfaces of the bottom of the fuse block 20 of the case main body 50. The relays 25 are disposed on an inner surface of the bottom of the cover 26.

Bus bars (corresponding to conductive members in accordance with the present invention) 24 each bent into a substantial S shape as viewed from the lateral direction are installed in the fuse installing portion 22, positioned in the left of FIG. 7. A right end of each of the bus bars 24 is located opposite the interior of the fuse installing portion 22. As shown in FIG. 7, the bus bar 24 is electrically connected to the circuit board 11 via the fuses 15 and the terminal fittings 19. The bus bar 24 has a cooled portion 61 formed thereon and extending in a direction in which the bus bar 24 crosses a plate surface of the circuit board 11. A plurality of relays (corresponding to heat generating components in accordance with the present invention) 25 are connected to a top surface of the cooled portion 61 in FIG. 7 and are each positioned so that the bottom thereof is located on the lower side. Although in FIG. 7, the bus bar 24 is electrically connected to the circuit board 11 via the fuse 15, the bus bar 24 may be connected directly to the circuit board 11 by soldering or the like. As shown in FIG. 2, the bus bars 24 are arranged at intervals so as to extend from the lower edge of the circuit board 11.

An insulating film (not shown) is formed on each entire terminal fitting 19 and each entire bus bars 24 except for portions thereof connected to the fuse 15 and the relay 25, respectively. This makes it possible to prevent the adjacent terminal fittings 19 or the adjacent bus bars 24 from being short-circuited even if dust adheres across the terminal fittings 19 or the bus bars 24.

Side suction ports 62 are formed in a side wall of the relay accommodating portion 51 so as to extend in the lateral direction of FIG. 5 and to lie in juxtaposition in the vertical direction of FIG. 5. As shown in FIG. 4, bottom suction ports 63 are formed in a bottom wall of the relay accommodating portion 51 so as to extend in the vertical direction of FIG. 4 and to lie in juxtaposition in the lateral direction of FIG. 4. The side suction ports 62 and the bottom suction ports 63 allow outside air to flow into the case 10.

On the other hand, as shown in FIG. 7, main body exhaust ports 45 that open rightward are formed at positions close to an upper end of the right side wall of the case 10 in FIG. 7. The main body exhaust ports 45 allow air to flow from the interior to exterior of the case 10. As shown in FIG. 3, the main body exhaust ports 45 are arranged at intervals in juxtaposition at positions close to an upper end of the side wall of the case main body 50 so as to extend in the lateral direction of FIG. 3. As shown in FIG. 7, cover exhaust ports 46 are formed at positions close to an upper end of the side wall of the cover 26 which is located opposite the circuit board 11, so as to penetrate the cover 26 and to open leftward. The cover exhaust ports 46 allow the air in the case 10 to flow out of the case 10.

The non-mounting surface 64 of the circuit board 11 is located opposite an inner wall surface 65 of the left side wall of the cover 26 in FIG. 6. This forms a ventilation path 66 between the non-mounting surface 64 of the circuit board 11 and the inner wall surface 65 of the cover 26 so that air can flow through the ventilation path 66 in the vertical direction.

A lower end of the ventilation path 66 is continuous with the space in the relay accommodating portion 51, which also constitutes the ventilation path 66. That is, the side suction ports 62 and bottom suction ports 63, formed in the relay accommodating portion 51 are continuous with the ventilation path 66.

The cooled portion 61 is positioned at the bottom of the relay accommodating portion 51 and disposed in the ventilation path 66. Air flowing from the bottom suction ports 63 into the relay accommodating portion 51 and rising through the ventilation path 66 flows between the bus bars 24, constituting the cooled portion 61, in the vertical direction.

On the other hand, an upper end of the ventilation path 66 is continuous with the cover exhaust ports 46 described above. As shown in FIGS. 6 and 7, the spaces in the case 10 are in communication with one another above an upper edge of the circuit board 11. An upper end of the ventilation path 66 is also in communication with the main body exhaust ports 45 described above.

The opening area of the main body and cover exhaust ports 45 and 46 is set larger than that of the side suction ports 62 and bottom suction ports 63.

The operation and effects of the present illustrative aspect will be described. When the electric connection box energizes the on-vehicle electric components, current flows through each of the relays 25. The relay 25 then generates heat to increase the temperature thereof. Outside air then flows through the bottom suction ports 63 in the relay accommodating portion 51 into the relay accommodating portion 51

(ventilation path 66). The air having flowed in through the bottom suction ports 63 flows upward between the bus bars 24, constituting the cooled portion 61. The air thus contacts the entire surface of the cooled portion 61 of each of the bus bars 24, enabling the bus bar 24 to be efficiently cooled. Heat generated by the relay 25, connected to the cooled portion 61, is transmitted to the cooled portion 61, improving the cooling efficiency of the relay 25.

The air having passed through the cooled portion 61 comes into contact with the relay 25 to receive the heat generated by the relay 25. The air can flow between the bus bars 24, constituting the cooled portion 61, and can thus flow easily into the area between the relay 25 and the bus bar 24. This makes it possible to inhibit heat from remaining in the area between the relay 25 and the bus bar 24. Moreover, since the relay 25 is connected to the cooled portion 61 and positioned so that the bottom thereof is located on the lower side, the bottom of the relay 25 can be efficiently cooled. Relay components (not shown) such as a coil are arranged at the bottom of the relay 25, which is thus likely to be relatively hot. The present illustrative aspect can efficiently cool the bottom of the relay 25, which is likely to become hot, more appropriately inhibiting the relay 25 from becoming locally hot.

The air having flowed into the relay accommodating portion 51 through the side suction ports 62 comes into contact with each of the relays 25 in the lateral direction to receive the heat from the relay 25.

As described above, the air to which the heat has been transmitted from the bus bars 24 and the relays 25 has the temperature thereof raised and thus the density thereof reduced. The air then rises through the relay accommodating portion 51 under a chimney effect and enters the ventilation path 66, formed between the non-mounting surface 64 of the circuit board 11 and the inner wall surface 65 of the cover 26. The air then further rises under the chimney effect.

No electronic components such as the intermittent relays 12 and the resistors 13 are mounted on the non-mounting surface 64 of the circuit board 11. The inner wall surface 65 of the cover 26 is flat as described above. Thus, no flow resistance to the air having entered the ventilation path 66 exists. The present illustrative aspect thus enables the flow rate of the air flowing through the ventilation path 66 to be increased. This enables the cooling efficiency of the relays 25 to be improved.

The microcomputer 30, which is not resistant to heat, is mounted in the ECU 27. Thus, it is necessary to prevent heat generated by the circuit board 11 or the relays 25 from being transmitted to the microcomputer 30. It is possible to separate the ECU 27 from the circuit board 11 as far as possible, but this is not preferable owing to the resulting increases in the size of the whole electric connection box. In view of this, the present illustrative aspect allows air to flow through the ventilation path 66 under the chimney effect. This makes it possible to inhibit heat from the circuit board 11 or the relays 25 from being transmitted to the ECU 27. This in turn eliminates the need to separate the ECU 27 from the cover 26, allowing a reduction in the size of the whole electric connection box.

The tips of the lead terminals 60 of the intermittent relays 12 and the resistor 13 project from the non-mounting surface 64 of the circuit board 11. When the intermittent relays 12 and the resistor 13 are energized, the heat generated by the intermittent relays 12 and the resistor 13 is transmitted to the lead terminals 60. The heat transmitted to the lead terminals 60 contacts the air flowing through the ventilation path 66 and is cooled by the air. This enables the cooling efficiency of the intermittent relays 12 and the resistor 13 to be improved.

The air having risen to the upper end of the ventilation path 66 flows from the main body exhaust ports 45 and the cover exhaust ports 46 to the exterior of the case 10. This allows the heat generated by the relays 25 to be efficiently dissipated to the exterior.

The tips of the lead terminals 60, exposed to the ventilation path 66, do not offer a large resistance to the flowing air. Consequently, the possible adverse effect of the tips is not serious enough to reduce the flow rate of the air flowing through the ventilation path 66.

The relays 25 are arranged inside the case at the bottom thereof. This makes it possible to make the lower part of the ventilation path 66 hotter than the upper part thereof. The flow rate of the air based on the chimney effect increases consistently with the difference in temperature between the upper part and lower part of the ventilation path 66. This enables a further increase in the flow rate of the air flowing through the ventilation path 66. Thus, heat dissipation can be further improved.

The air having flowed into the case 10 through the bottom suction ports 63, formed at the bottom wall of the cover 26, flows through the case 10 from the bottom to top thereof and out from the main body and cover exhaust ports 45 and 46. This prevents the flow path of the air from being bent as in the case in which the suction ports are formed in the side walls of the case 10. Consequently, an increase in the flow resistance of the air can be inhibited. The flow rate of the air thus increases, enabling the cooling efficiency of the relays 25 to be improved. Moreover, the air having flowed into the case 10 through the bottom suction ports 63, formed in the bottom wall of the cover 26, comes into contact with the relays 25 from below. This enables an increase in the time for which the air is in contact with the relays 25 compared to the case in which the suction ports are formed only in the side walls of the case 10 and the air having flowed in through the suction ports comes into contact with the relays 25 sideways, for example. As a result, the cooling efficiency of the relays 25 can be improved.

Furthermore, the air having the temperature thereof raised by the heat absorbed from the relays 25 has the volume thereof increased. Thus, the volume of the air in the main body and cover exhaust ports 45 and 46 is larger than that of the air measured when the air flows into the case 10 through the side and bottom suction ports 62 and 63. Consequently, if the opening area of the main body and cover exhaust ports 45 and 46 is set equal to that of the side and bottom suction ports 62 and 63, for example, the air may have difficulty flowing out from the main body and cover exhaust ports 45 and 46.

In accordance with the present illustrative aspect, the opening area of the main body and cover exhaust ports 45 and 46 is set larger than that of the side and bottom suction ports 62 and 63. Thus, even if the air having absorbed the heat from the relays 25 has the volume thereof increased, the air can flow out easily through the main body and cover exhaust ports 45 and 46.

If the electric connection box is disposed below a duct of an air conditioner, for example, water droplets concentrated in the dust may fall onto the electric connection box. In this case, when the main body and cover exhaust ports 45 and 46 are formed in a top wall of the case 10, water droplets may permeate into the case through the main body and cover exhaust ports 45 and 46. According to the present illustrative aspect, the main body and cover exhaust ports 45 and 46 are formed in the side walls of the case 10 so as to open sideways. This makes it possible to prevent water droplets falling from above from permeating into the case 10.

Furthermore, dust may flow into the case 10 through the side and bottom suction ports 62 and 63. When the dust comes into contact with the bus bars 24 so as to spread across the bus bars 24, the bus bars 24 may be short-circuited. According to the present illustrative aspect, the insulating film is formed on each of the bus bars 24. This makes it possible to prevent the bus bars 24 from being short-circuited even when the dust comes into contact with the bus bars 24 so as to spread across the bus bars 24.

Illustrative Aspect 2 of the present invention will be described below with reference to FIGS. 8 to 13.

(Circuit Board)

The circuit board 11 is substantially rectangular and has the conductive path (not shown) formed on the opposite surfaces thereof by the print wiring technique. The circuit board 11 has the intermittent relays 12 which are mounted on a left surface thereof in FIG. 12 (hereinafter sometimes referred to as a mounting surface) and which turn on and off the power supply to an on-board electric component (not shown) such as a fog lamp or a door lock which is intermittently used. The resistor 13 is mounted on the mounting surface of the circuit board 11 to prevent a counter electromotive force from being exerted by the intermittent relays 12. The circuit board 11 further has the male tab 17 mounted on the mounting surface via the male tab pedestal 18 and connected to the connector 14 (corresponding to an electric component in accordance with the present invention) for connection to an external circuit.

Figure 11:
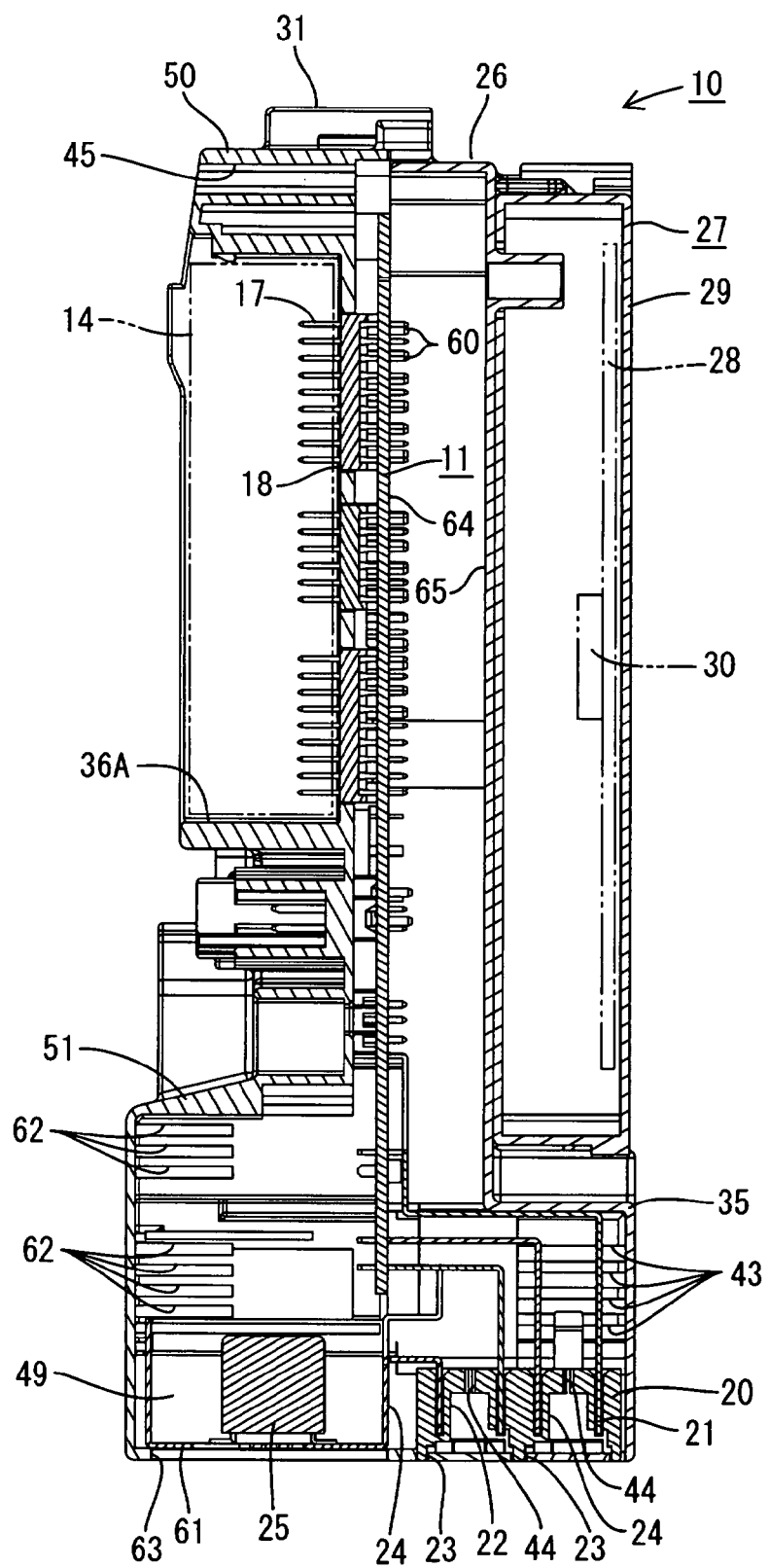
FIG. 11 is a sectional view taken along line C-C in FIG. 8.
Figure 12:
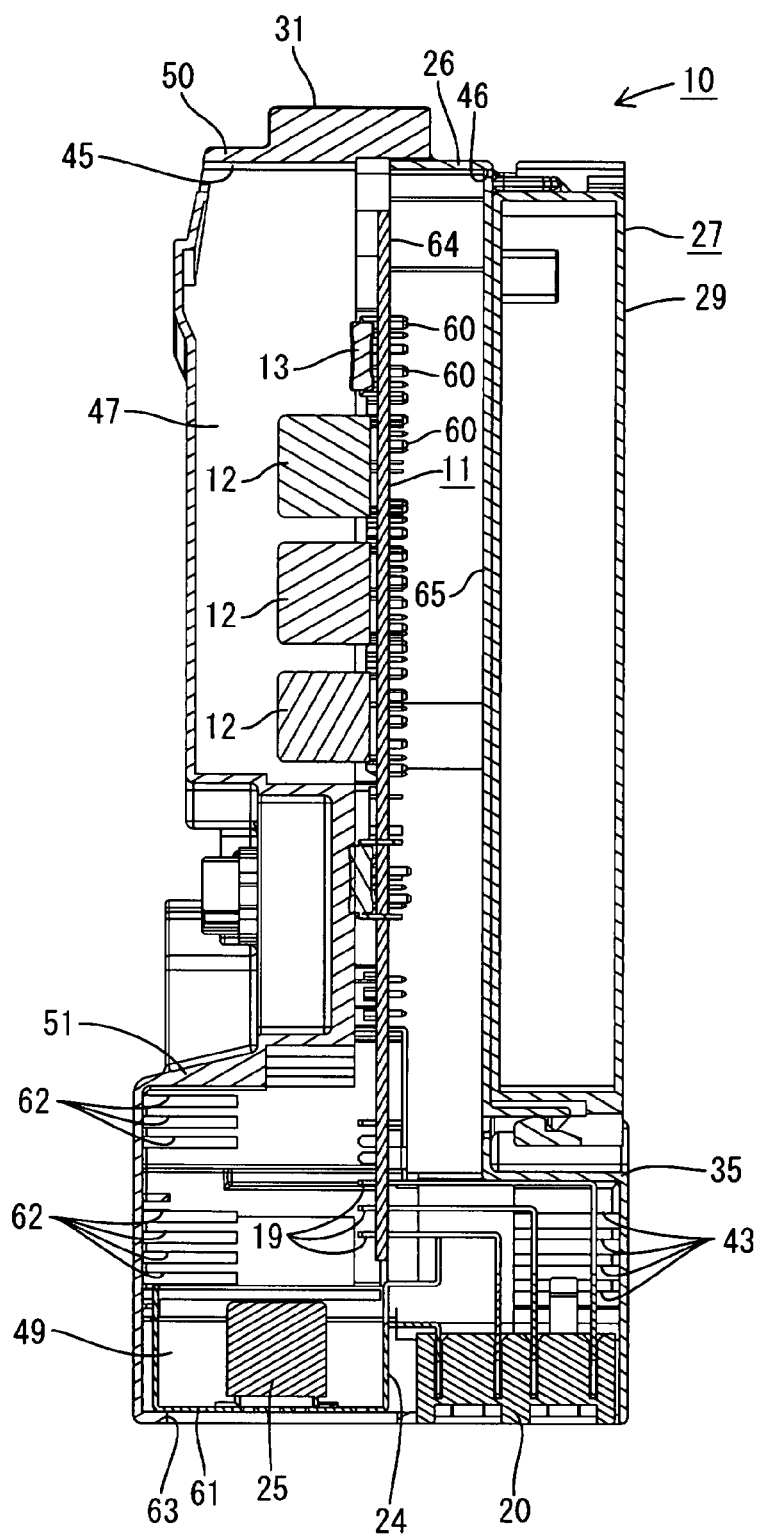
FIG. 12 is a sectional view taken along line D-D in FIG. 8.

As shown in FIGS. 11 and 12, one end of each of the plurality of terminal fittings 19 is attached to the lower end of the circuit board 11 so as to penetrate the circuit board 11. The other end of the terminal fitting 19 is folded downward into a substantial L shape and installed in the fuse block 20 described below. The other ends of the terminal fittings 19 constitute the fuse terminals 21 between which the fuses 15 are installed.

Figure 9:
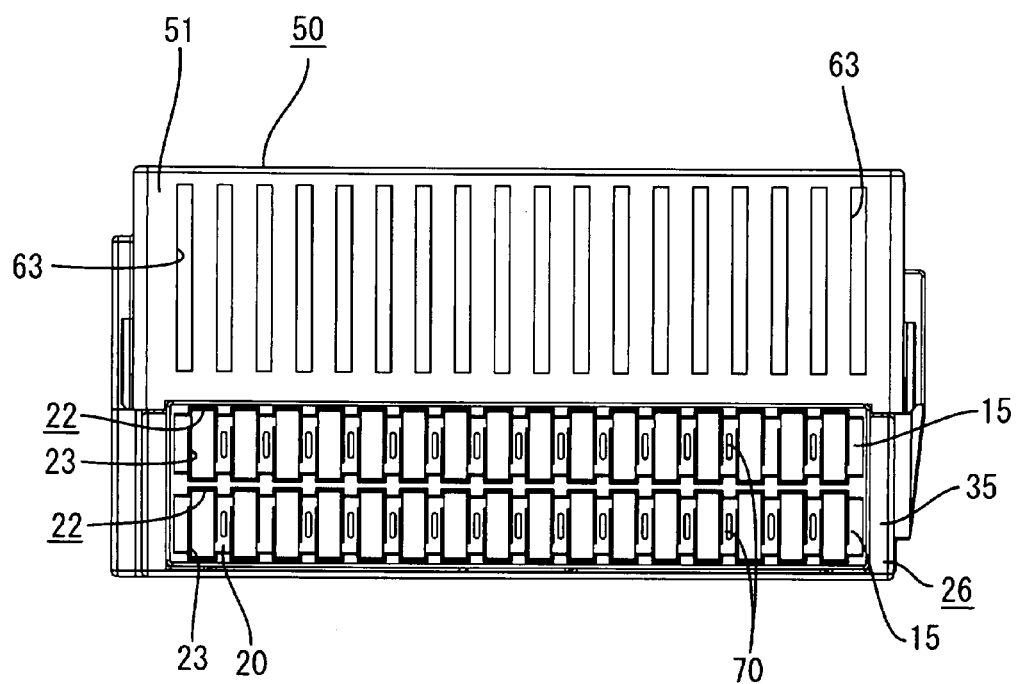
FIG. 9 is a bottom view of the electric connection box.

As shown in FIG. 11, the fuse block 20 is made of a synthetic resin and is substantially rectangular. The fuse block 20 has the fuse installing portions 22 formed on the bottom surface thereof so as to be depressed upward in FIG. 11 so as to allow the fuses 15 to be installed therein. The fuse block 20 also has the openings 23 formed therein so as to open downward. The fuse terminal 21 of each of the terminal fittings 19 described above is located in the corresponding fuse installing portion 22. As shown in FIG. 9, the fuse installing portions 22 are arranged in both the lateral and vertical directions of FIG. 9 (in the present illustrative aspect, the fuse installing portions 22 are arranged in two vertical stages).

Although not shown in detail, the relay terminal (not shown) is mounted on a non-mounting surface (a right surface of the circuit board 11 in FIG. 12) at the upper edge of the circuit board 11 and connected to the ECU 27 described below.

(Case)

As shown in FIG. 11, the case 10 is made of a synthetic resin and comprises the flat case main body 50 that accommodates the circuit board 11 and the cover 26 that covers the open surface of the case main body 50. The cover 26 has the ECU 27 mounted on the surface thereof located opposite the case main body 50.

The ECU 27 has the ECU circuit board 28 (shown by an alternate long and two short dashes line in FIG. 11) accommodated in the ECU case 29. The ECU circuit board 28 has the microcomputer 30 (shown by an alternate long and two short dashes line in FIG. 11) mounted thereon and the driving circuit for the intermittent relays 12 and the like formed thereon. The ECU circuit board 28 and the circuit board 11 are connected together by the relay terminal penetrating the cover 26 and the ECU case 29.

As shown in FIG. 11, the cover 26 is shaped like a shallow plate and mounted so as to close the open surface of the case main body 50. The lower end of the cover 26 bulges rightward in FIG. 11 to constitute the fuse accommodating portion 35, which accommodates the fuse block 20 as described above. The lower end of the fuse accommodating portion 35 opens downward so as to form an opening 23 in which the fuse block 20 is installed. As shown in FIG. 11, the lower opening edge of the fuse accommodating portion 35 is substantially flush with the outer side surfaces of the bottom of the fuse block 20.

The connector fitting portion 36 (corresponding to a fitting recess in accordance with the present invention) in which the connector 14 is installed is formed in a left side wall of the case main body 50 in FIG. 11 so as to be depressed toward the circuit board 11 (toward the right in FIG. 11).

Figure 8:
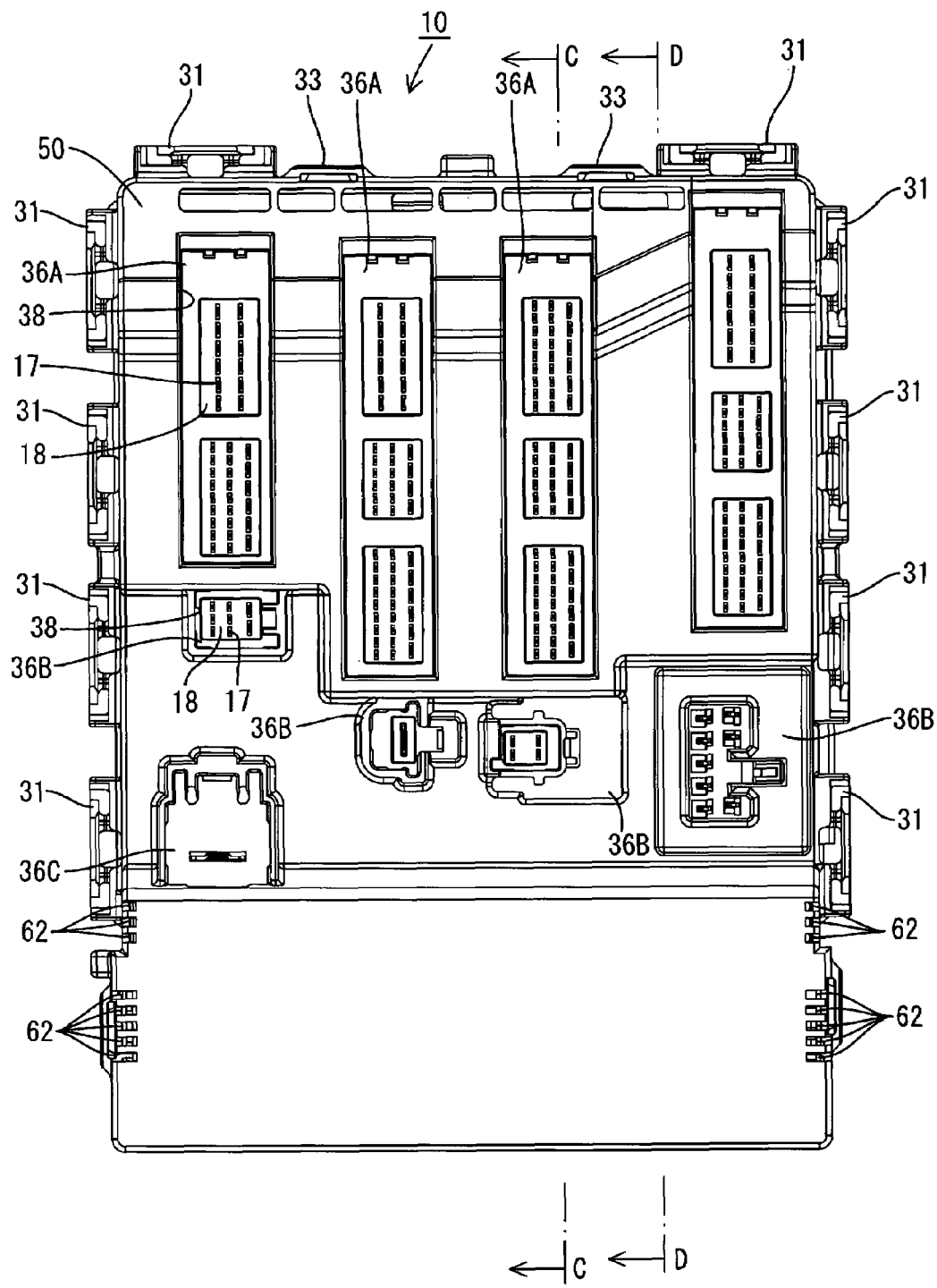
FIG. 8 is a front view of an electric connection box in accordance with Illustrative Aspect 2 of the present invention.
Figure 13:
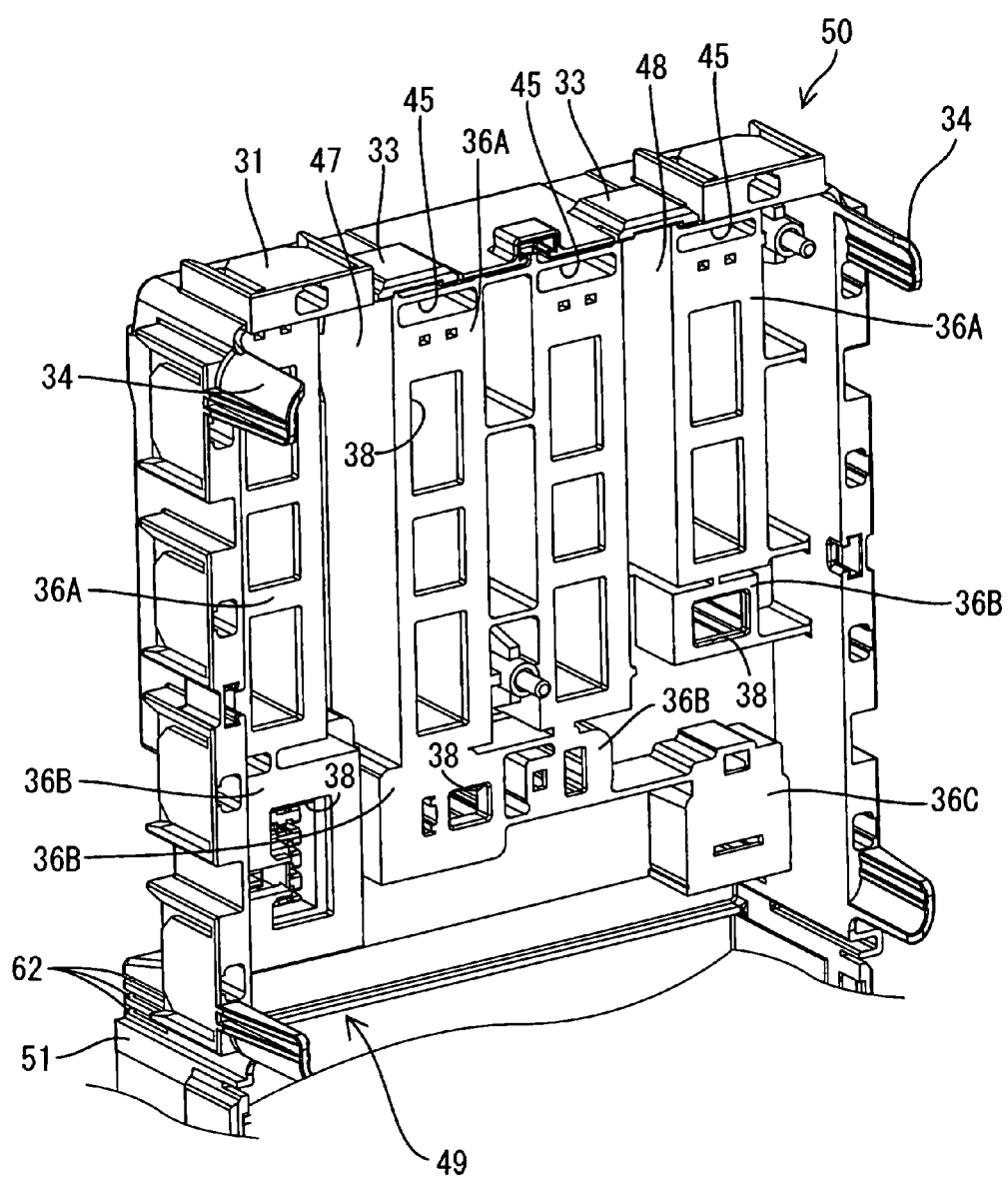
FIG. 13 is an enlarged rear view of an essential part of a case main body.

As shown in FIG. 8, the plurality of (in the illustrative aspect, four) upper connector fitting portions 36A formed on the upper side of the case main body 50 extend in the vertical direction and arranged at intervals in the lateral direction of FIG. 8. Below the upper connector fitting portions 36A, the plurality of (in the illustrative aspect, four) lower connector fitting portions 36B are formed at intervals in the lateral direction of FIG. 8. The power source connector fitting portion 36C connected to the power source line (not shown) to the battery is formed below the lower connector fitting portion 36B positioned at the left end in FIG. 8. As shown in FIG. 13, the window 38 is formed in the inner wall of each of the upper and lower connector fitting portions 36A and 36B. The male tabs 17 and male tab pedestals 18, described above, lie opposite the upper and lower fitting portions 36A and 36B across the windows 38. The male tabs 17 project from the inner wall of the power source connector fitting portion 36C.

As shown in FIG. 11, the lower end of the case main body 50 bulges leftward in FIG. 11 so as to constitute the relay accommodating portion 51 that accommodates relays 25 described above. As shown in FIG. 11, the outer side surfaces of the bottom wall of the relay accommodating portion 51 are flush with the outer side surfaces of the bottom of the fuse block 20 of the case main body 50.

Figure 10:
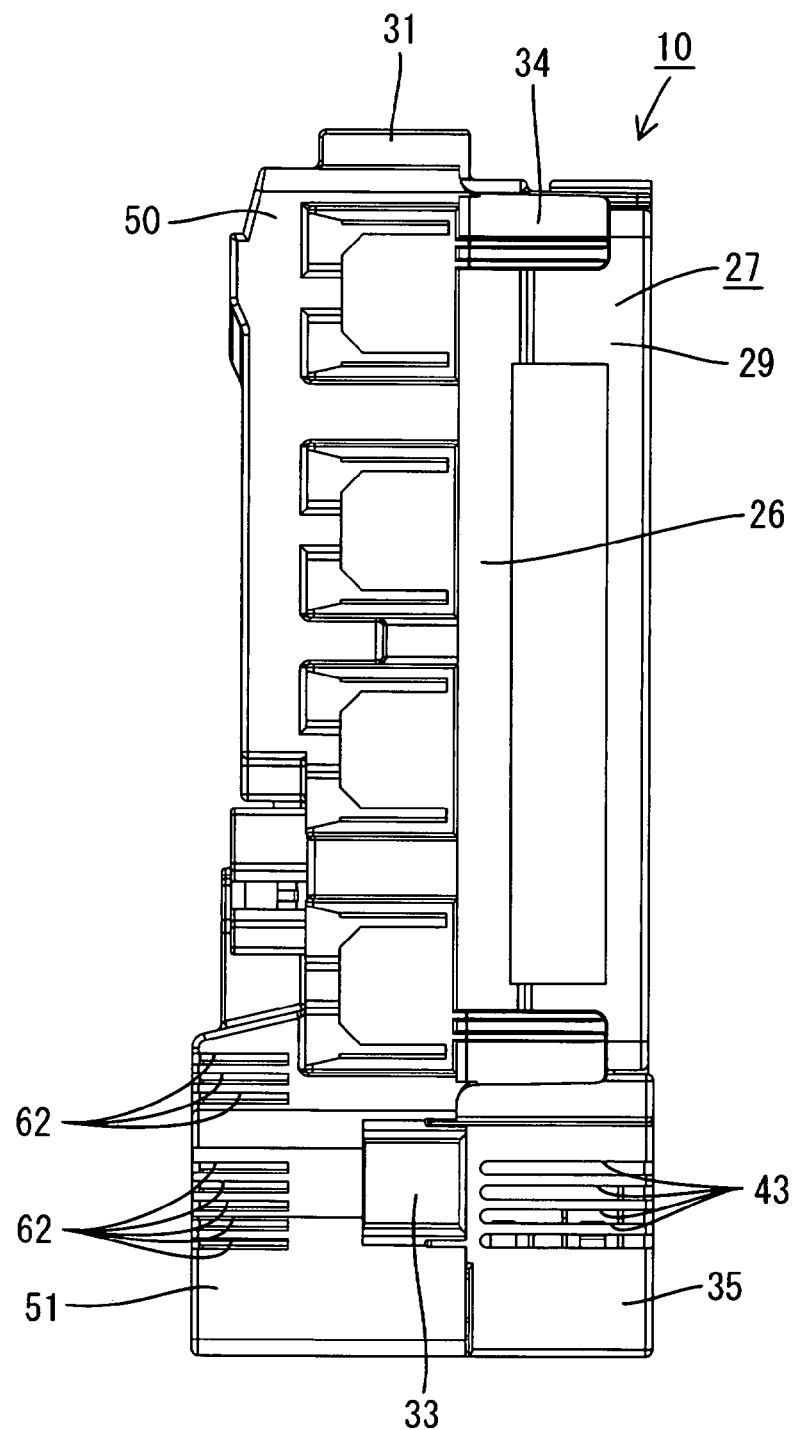
FIG. 10 is a side view of the electric connection box.

As shown in FIG. 10, the side suction ports 62 are arranged on side walls of the relay accommodating portion 51 in a vertical direction so as to extend in the lateral direction of FIG. 10. The side suction ports 62 allow outside air to flow into the case 10. Furthermore, as shown in FIG. 9, the bottom suction ports 63 are formed in a bottom wall of the fuse block 20 so as to extend in the lateral direction of FIG. 9. The bottom suction ports 63 allow outside air to flow into the case 10.

On the other hand, as shown in FIG. 12, the main body exhaust ports 45 that open leftward are formed at positions close to the upper end of the left side wall of the case 10 in FIG. 12. The main body exhaust ports 45 allow air to flow from the interior to exterior of the case 10. As shown in FIG. 8, the main body exhaust ports 45 are arranged at intervals in juxtaposition at positions close to the upper end of the side wall of the case main body 50 so as to extend in the lateral direction of FIG. 8. As shown in FIG. 12, the cover exhaust ports 46 are formed at positions close to the upper end of the side wall of the cover 26 which is located opposite the circuit board 11, so as to penetrate the cover 26 and to open rightward. The cover exhaust ports 46 allow the air in the case 10 to flow out of the case 10.

As shown in FIG. 13, the upper connector fitting portions 36A, the lower connector fitting portions 36B, and the power source connector fitting portion 36C described above are formed on a wall surface of the case main body 50 which is located opposite the circuit board 11, so as to be depressed toward the circuit board 11 (toward the reader in FIG. 13). This forms a plurality of recesses and protrusions on the wall surface of the case main body 50 which is located opposite the circuit board 11.

The recesses and protrusions form a vertically extending space between the upper connector fitting portion 36A and lower connector fitting portion 36B positioned at the leftmost end in FIG. 13 and the second leftmost upper connector fitting portion 36A and lower connector fitting portion 36B. The space constitutes an upper first ventilation path 47 through which air can flow in the vertical direction. The intermittent relays 12 and the resistor 13 described above are arranged in the upper first ventilation path 47.

Furthermore, a vertically extending space is formed between the upper connector fitting portion 36A and lower connector fitting portion 36B positioned at the rightmost end in FIG. 13 and the second rightmost upper connector fitting portion 36A. A lower end of the vertically extending space is surrounded by a lower edge of the rightmost lower connector fitting portion 36B and an upper edge of the power source connector fitting portion 36C and is continuous with a laterally extending space. A right end of the laterally extending space is continuous with a vertically extending space surrounded by a right side wall of the case main body 50 in FIG. 13 and the power source connector fitting portion 36C. This generally forms an upper second ventilation path 48 through which air can flow in the vertical direction.

Upper ends of the first and second ventilation paths 47 and 48 are continuous with the main body exhaust ports 45, described above. As shown in FIGS. 11 and 12, the spaces in the case 10 are in communication with one another above the upper edge of the circuit board 11. The upper ends of the first and second ventilation paths 47 and 48 are also in communication with the cover exhaust ports 46, described above.

On the other hand, as shown in FIG. 13, lower ends of the first and second ventilation paths 47 and 48 are continuous with the space in the relay accommodating portion 51, which constitutes a lower ventilation path 49. The cooled portions 61 of the bus bars 24 are positioned in the lower ventilation path 49 and connect to the relays 25.

The remaining part of the configuration is substantially similar to that in Illustrative Aspect 1. Thus, the same components are denoted by the same reference numerals, and the description thereof is omitted to avoid duplication.

The operation and effects of the present illustrative aspect will be described. When the electric connection box energizes the on-vehicle electric components, current flows through each of the relays 25. The relay 25 then generates heat to increase the temperature thereof. Outside air then flows through the bottom suction ports 63 in the relay accommodating portion 51 into the relay accommodating portion 51 (ventilation path 66). The air having flowed in through the bottom suction ports 63 flows upward between the bus bars 24, constituting the cooled portion 61. The air thus contacts the entire surface of the cooled portion 61 of each of the bus bars 24, enabling the bus bar 24 to be efficiently cooled. Heat generated by the relay 25, connected to the cooled portion 61, is transmitted to the cooled portion 61, improving the cooling efficiency of the relay 25.

The air having passed through the cooled portion 61 contacts the relay 25 to receive the heat generated by the relay 25. The air can flow between the bus bars 24, constituting the cooled portion 61, and can also flow easily into the area between the relay 25 and the bus bar 24. This makes it possible to inhibit heat from remaining in the area between the relay 25 and the bus bar 24. Moreover, since the relay 25 is connected to the cooled portion 61 and positioned so that the bottom thereof is located on the lower side, the bottom of the relay 25 can be efficiently cooled. The relay components (not shown) such as the coil are arranged at the bottom of the relay 25, which is thus likely to be relatively hot. The present illustrative aspect can efficiently cool the bottom of the relay 25, which is likely to become hot, more appropriately inhibiting the relay 25 from becoming locally hot.

The air in the space (lower ventilation path 49) in the relay accommodating portion 51 has the temperature thereof increased and thus the density thereof reduced by the heat transmitted to the air from the relays 25 and bus bars 24. The air thus rises through the lower ventilation path 49 under the chimney effect. The air then moves to the upper first ventilation path 47 or the upper second ventilation path 48.

The air having moved to the upper first ventilation path 47 rises through the upper first ventilation path 47 under the chimney effect and then flows to the exterior of the case 10 through the main body exhaust ports 45 and the cover exhaust ports 46. This allows the heat generated by the relays 25 to be efficiently dissipated to the exterior.

The air having entered the upper second ventilation path 48 rises through the upper second ventilation path 48 under the chimney effect. The air then comes into contact with the intermittent relays 12 and resistor 13, arranged in the upper second ventilation path 48. Heat generated by the intermittent relays 12 and the resistor 13 is thus transmitted to the air. The intermittent relays 12 and the resistor 13 are intermittently energized and thus have a smaller total heat value than the relays 25. This prevents the temperature of the vicinity of the intermittent relays 12 and resistor 13 from increasing above the temperature of the vicinity of the relays 25. This in turn prevents the chimney effect from being inhibited.

The air having risen through the upper second ventilation path 48 under the chimney effect flows out of the case 10 through the main body exhaust ports 45 and the cover exhaust ports 46. This allows the heat generated by the relays 25 to be efficiently dissipated to the exterior.

If the connector fitting portions 36 and the like are formed on the wall surface of the case main body 50 so as to be depressed toward the circuit board 11, recesses and protrusions are formed in the case 10. Thus, even with an attempt to allow air to flow through the case 10 to cool the heat generating components such as the relays 25, the air may fail to flow efficiently, preventing a sufficient cooling effect from being exerted.

Thus, according to the present illustrative aspect, the wall surface of the case main body 50 which is located opposite the circuit board 11 is depressed toward the circuit board 11. The upper, lower, and power source connector fitting portions 36A, 36B, and 36C are then formed on the depressed wall surface. The recesses and protrusions thus formed in the case 10 are utilized to form the first, second, and lower ventilation paths 47, 48, and 49 through which air can flow in the vertical direction. As a result, air having flowed in through the side and bottom suction ports 62 and 63 comes into contact with the relays 25, arranged in the lower ventilation path 49. Heat generated by the relays 25 is transmitted to the air, which thus becomes hot. The air then rises from the lower ventilation path 49 through the first and second ventilation paths 47 and 48 under the chimney effect. The air then flows out from the main body and cover exhaust ports 45 and 46 to release the heat generated by the fuses 15 to the exterior of the case 10. This enables the heat dissipation of the electric connection box to be improved.

Illustrative Aspect 3 of the present invention will be described with reference to FIGS. 14 to 18.

Figure 14:
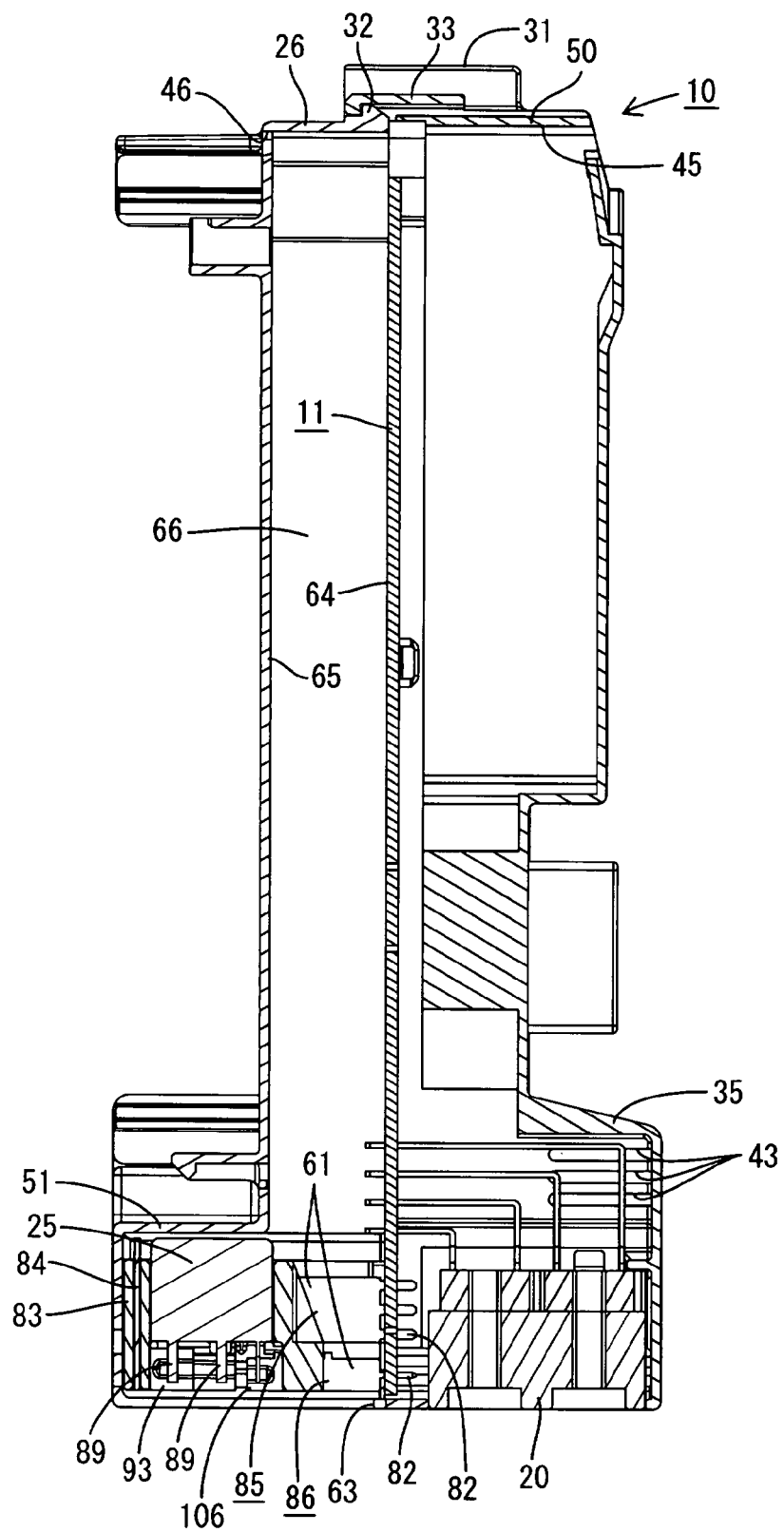
FIG. 14 is a sectional view of an electric connection box in accordance with Illustrative Aspect 3 of the present invention.
Figure 15:
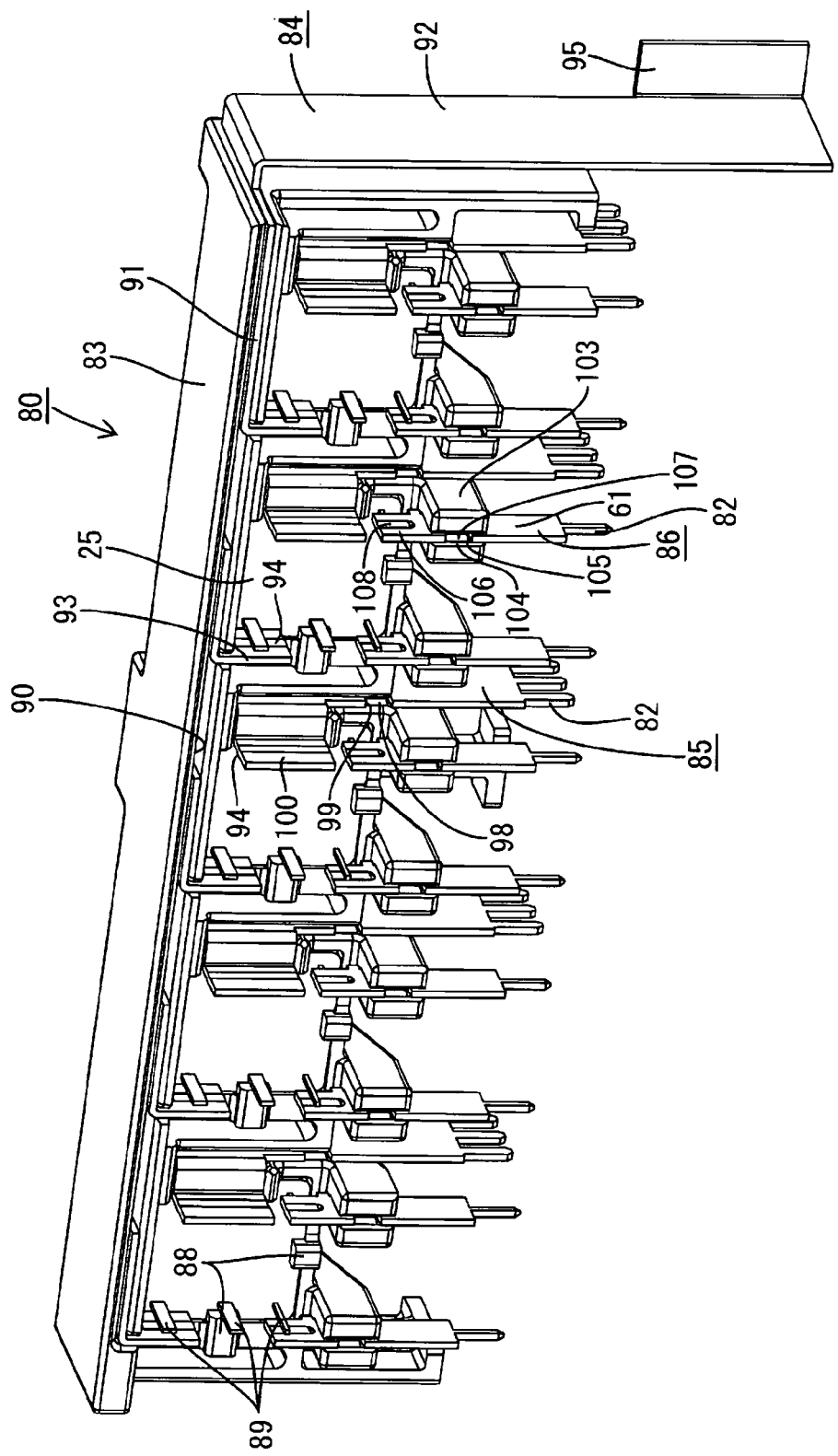
FIG. 15 is an enlarged perspective view showing an essential part of a relay unit.
Figure 17:
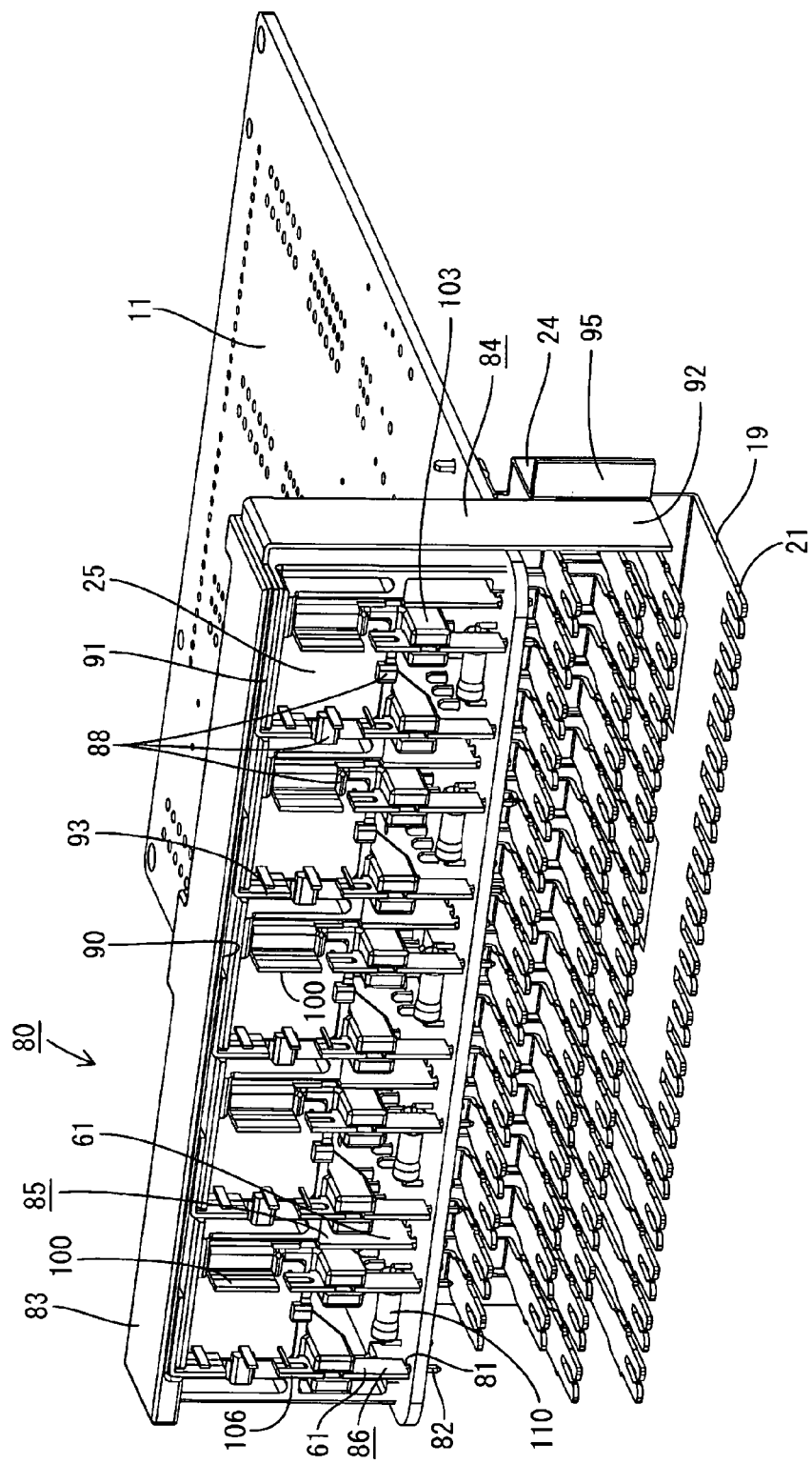
FIG. 17 is an enlarged perspective view showing an essential part of a connection structure between a circuit board and the relay unit.

As shown in FIG. 14, a relay unit 80 including the relays 25 is mounted at the lower end of the circuit board 11. As shown in FIG. 17, through-holes 81 are formed through the plate surface of the circuit board 11 at the lower end thereof. Tabs 82 of the relay unit 80 described below are inserted through the respective through-holes 81 and soldered to the conductive path on the circuit board 11. The circuit board 11 is thus electrically connected to the relay unit 80.

Figure 16:
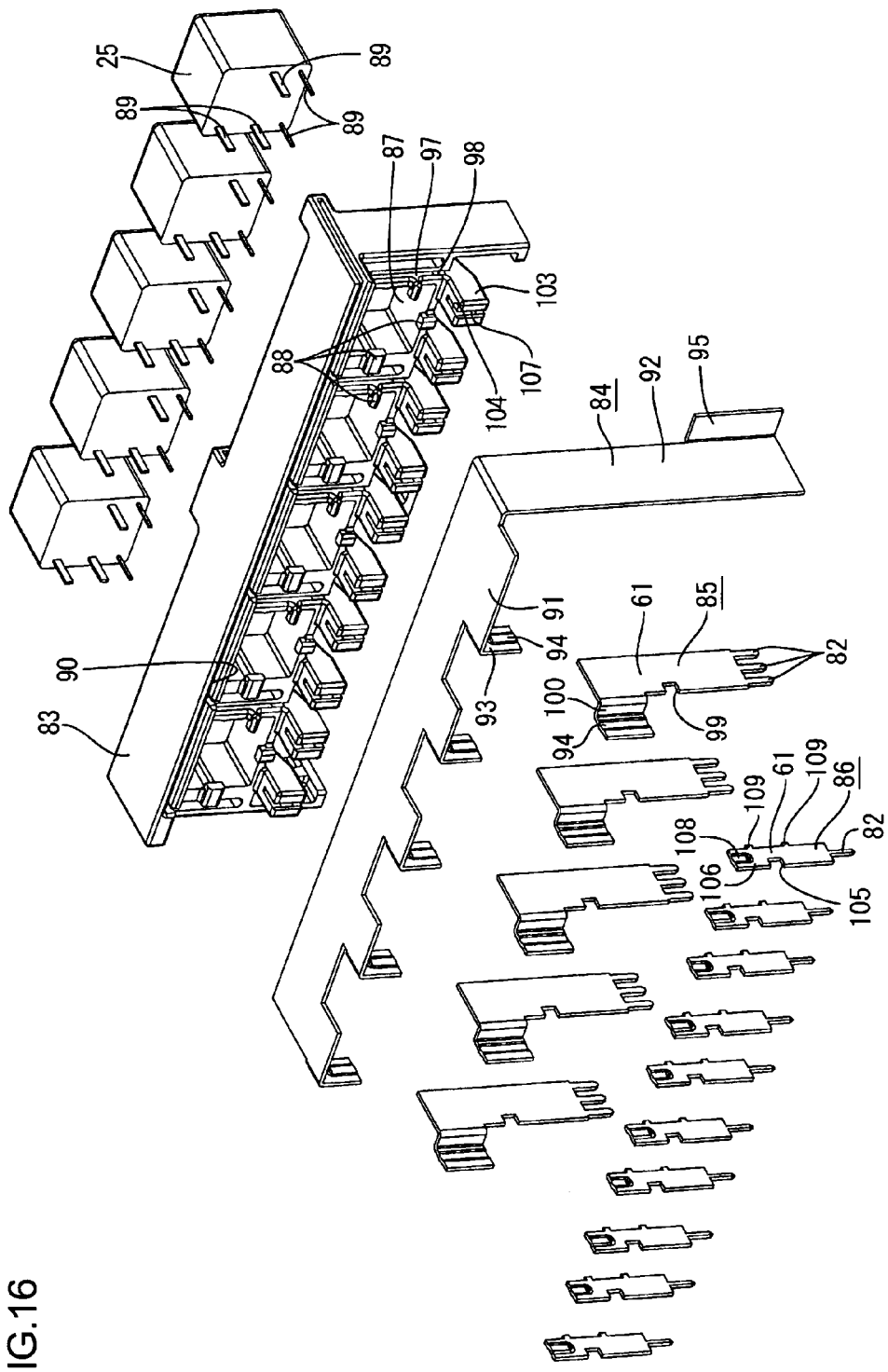
FIG. 16 is an enlarged exploded perspective view showing the essential part of the relay unit.

The relay unit 80 is made up of a metal bus bar 84, the relays 25, first connection fittings 85, and second connection fittings 86 which are assembled to a frame 83 of a synthetic resin. As shown in FIG. 16, the frame 83 is shaped substantially like a block and has relay assembly windows 87 which penetrate the frame 83 in the lateral direction of FIG. 16 and in which the relays 25 are assembled. The frame 83 has relay supports 88 projecting inward of the relay assembly window 87 to support the relays 25. Thus, when the relays 25 are positioned as shown in FIG. 14 and assembled in the frame 83, the bottom of each of the relays 25 comes into contact with a top surface of the corresponding relay support 88 from above to prevent the relays 25 from being displaced downward. A plurality of lead terminals 89 are protrusively formed at the bottom of the relay 25.

A bus bar accommodating groove 90 accommodating the bus bar 84 is formed at an upper edge of the frame 83 in FIG. 16 so as to be depressed obliquely rightward and rearward. A first connection fitting accommodating groove 97 in which the corresponding first connection fitting 85 is accommodated is formed on the side of each of the relay assembly windows 87 so as to be depressed rightward and rearward in FIG. 16. An engaging protrusion 98 protruding inward of each of the first connection fitting accommodating grooves 97 is provided on an inner wall surface of the first connection fitting accommodating groove 97. The engaging protrusion 98 can engage an engaging recess 99 in the corresponding first connection fitting 85 described below. Second connection fitting attaching portions 103 are formed at a lower edge of the frame in FIG. 16 so as to project leftward and frontward so that the second connection fittings 86 can be attached to the respective second connection fitting attaching portions 103. An accommodating groove 104 is formed in each of the second connection fitting attaching portions 103 so as to be depressed rightward and inward; each of the second connection fittings 86 is accommodated in the corresponding accommodating groove 104. An engaging protrusion 107 protruding inward of the accommodating groove 104 is provided on an inner wall surface of the accommodating groove 104. The engaging protrusion 107 can engage an engaging recess 105 in the corresponding second connection fitting 86 described below.

The bus bar 84 is generally L-shaped and comprises an accommodating portion 91 accommodated in the bus bar accommodating groove 90, described above, and an extending portion 92 extending downward from the accommodating portion 91 and electrically connected to the circuit board 11. Relay connections 93 bent downward in FIG. 16 and connected to the lead terminals 89 of the respective relays 25 are formed on the accommodating portions 91. Each of the relay connections 93 has a welding protrusion 94 welded to the corresponding lead terminals 89 by a well-known technique. On the other hand, each of the extending portions 92 has a connection piece 95 projecting from a lower end thereof in FIG. 16. The connection piece 95 is welded to the corresponding bus bar 24 disposed on the circuit board 11 by a well known technique.

The first connection fitting 85 is made by pressing a metal plate into a predetermined shape. A relay connection 100 projecting leftward and frontward and bent into a crank shape is provided at an upper edge of the first connection fitting 85 in FIG. 16. The welding protrusion 94 is provided on the relay connection 100. The welding protrusion 94 is welded to the lead terminals 89 on the corresponding relay 25 by a well-known technique. The first connection fitting 85 has an engaging recess 99 formed below the relay connection 100 and which can engage the corresponding engaging protrusion 98 described above. With the first connection fittings 85 accommodated in the respective first connection fitting accommodating grooves 97 in the frame 83, the engaging protrusions 98 engage the respective engaging recesses 99 to prevent the first connection fittings 85 from slipping out.

A tab 82 is formed at a lower edge of each of the first connection fittings 85 in FIG. 16 so as to project downward; the tab 82 is inserted through the corresponding through-hole 81, formed in the circuit board 11, and soldered to the conductive path on the circuit board 11.

The second connection fitting 86 is made by pressing a metal plate into a predetermined shape. A relay connection 106 is provided at an upper edge of the second connection fitting 86 in FIG. 16. A welding protrusion 108 is provided on the relay connection 106. The welding protrusion 108 is welded to the lead terminals 89 on the corresponding relay 25 by a well-known technique. A pair of engaging protrusions 109, 109 is provided below the relay welding portion 106 so as to project rightward and rearward. With the second connection fittings 86 accommodated in the respective accommodating grooves 104, each of the second connection fitting attaching portions 103 is sandwiched between the corresponding engaging protrusions 109, arranged in the vertical direction of FIG. 16. This prevents the second connection fitting 86 from being displaced in the vertical direction of FIG. 16. An engaging recess 105 is formed below the welding protrusion 108 of the second connection fitting 86 so as to be depressed rightward and rearward in FIG. 16. With the second connection fittings 86 accommodated in the respective accommodating grooves 104, each of the engaging recesses 105 engages the corresponding engaging protrusion 107 to prevent the corresponding second connection fitting 86 from slipping out.

The tab 82, inserted through the corresponding through-hole 81 in the circuit board 11 and soldered to the conductive path on the circuit board 11, is formed at the lower end of the corresponding second connection fitting 86 so as to project downward.

Figure 18:
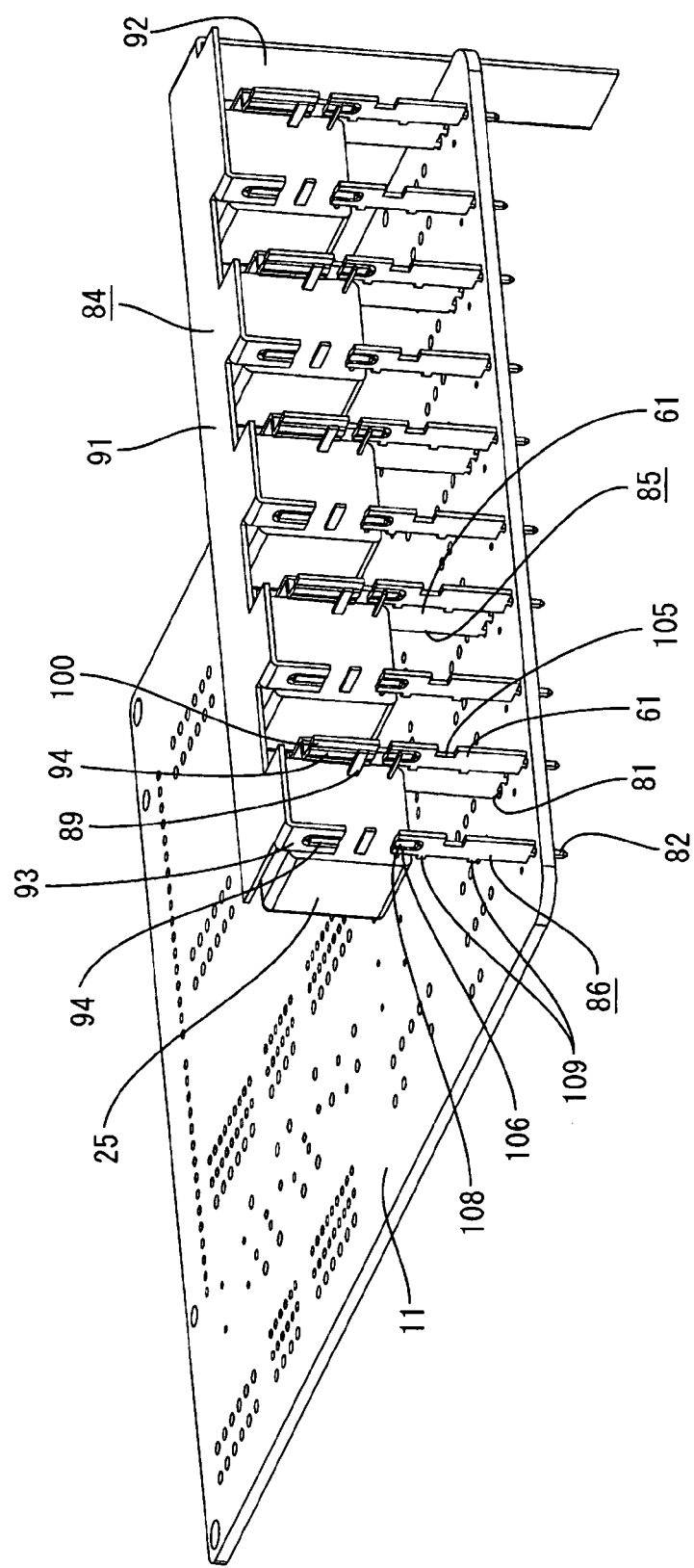
FIG. 18 is an enlarged perspective view showing an essential part of a connection structure between the circuit board and each of a first connection fitting and a second connection fitting.

As shown in FIG. 18, the plurality of first connection fittings 85 and second connection fittings 86 extend away from the plate surface of the circuit board 11 and are arranged at intervals in juxtaposition. The relay connection 93 is formed at an upper end of each of the first and second connection fittings 85 and 86 in FIG. 18 and connected to the lead terminals 89 of the corresponding relay 25. On the other hand, each of the first and second connection fittings 85 and 86 has the corresponding tab 82 formed at the lower end thereof in FIG. 18; the tab 82 is inserted through the corresponding through-hole 81 in the circuit board 11 and soldered to the circuit board 11.

As shown in FIG. 14, areas of the first and second connection fittings 85 and 86 which are positioned in the ventilation path 66 constitute the cooled portions 61. Each of the cooled portions 61 includes the relay connection 93.

An insulating film (not shown) is formed on the entirety of each of the first and second connection fittings 85 and 86 and the bus bars 84 except for the connections thereof to the respective relays 25. This makes it possible to prevent the first connection fitting 85 and the adjacent second connection fitting 86 from being short-circuited even if dust enters the case 10 and contacts the first and second connection fittings 85 and 86 so as to spread between the first and second connection fittings 85 and 86. An insulation film (not shown) is also formed on the surface of the circuit board 11.

As shown in FIG. 17, the relays 25 are arranged away from the plate surface of the circuit board 11. A resistor 110 is mounted in an area of the circuit board 11 which is located opposite each of the relays 25.

The remaining part of the configuration is substantially similar to that in Illustrative Aspect 1. Thus, the same components are denoted by the same reference numerals, and the description thereof is omitted to avoid duplication.

According to the present illustrative aspect, heat generated by each of the relays 25 is transmitted to the cooled portions 61 of the corresponding first and second connection fittings 85 and 86 from the lead terminals 89. Since the cooled portions 61 are positioned in the ventilation path 66, through which air flows upward, the air contacts the entire surface of the cooled portions 61. The first and second connection fittings 85 and 86 can thus be efficiently cooled. This reduces the quantity of heat transmitted to the soldered portion between each of the tabs 82 of the first and second connection fittings and the circuit board 11. This in turn inhibits the possible expansion and contraction of the circuit board 11 caused by heat. The soldered portion between each of the tabs 82 of the first and second connection fittings 85 and 86 and the circuit board 11 can thus be inhibited from being cracked by the possible expansion and contraction of the circuit board 11. This makes it possible to improve the reliability of the connection between each of the first and second connection fittings 85 and 86 and the circuit board 11.

Air having passed through the cooled portions 61 comes into contact with the relay 25. The heat generated by the relay 25 is then transmitted to the air. The air can flow between the first and second connection fittings 85 and 86, constituting the cooled portions 61, and can also flow easily into the area between the relay 25 and both the first and second connection fittings 85 and 86. This makes it possible to inhibit heat from remaining in the area between the relay 25 and both the first and second connection fittings 85 and 86. Moreover, the air contacts and directly cools the relay 25, the lead terminals 89, the first connection fitting 85, and the second connection fitting 86.

Illustrative Aspect 4 of the present invention will be described with reference to FIGS. 19 to 23.

Figure 21:
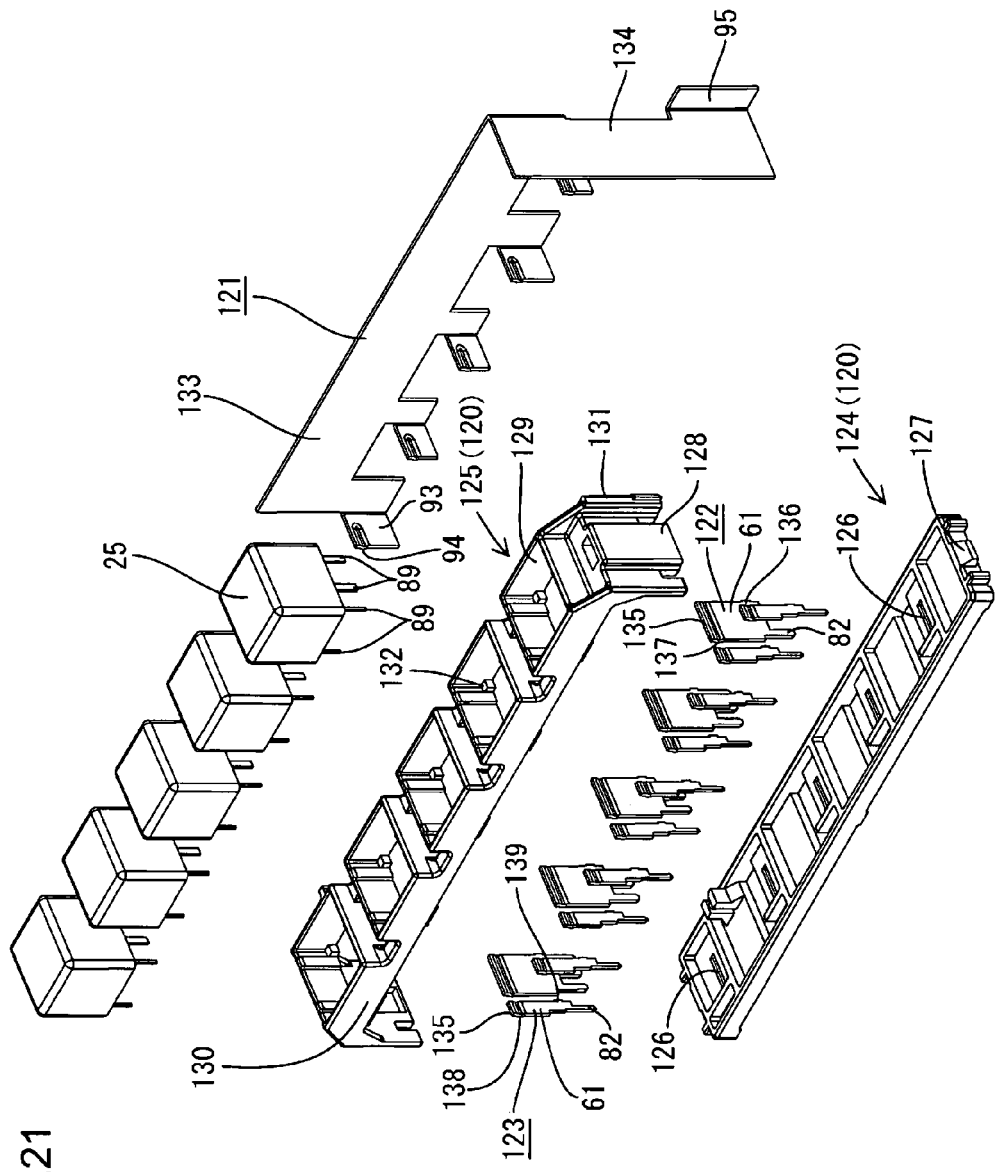
FIG. 21 is an enlarged exploded perspective view showing the essential part of the relay unit.
Figure 22:
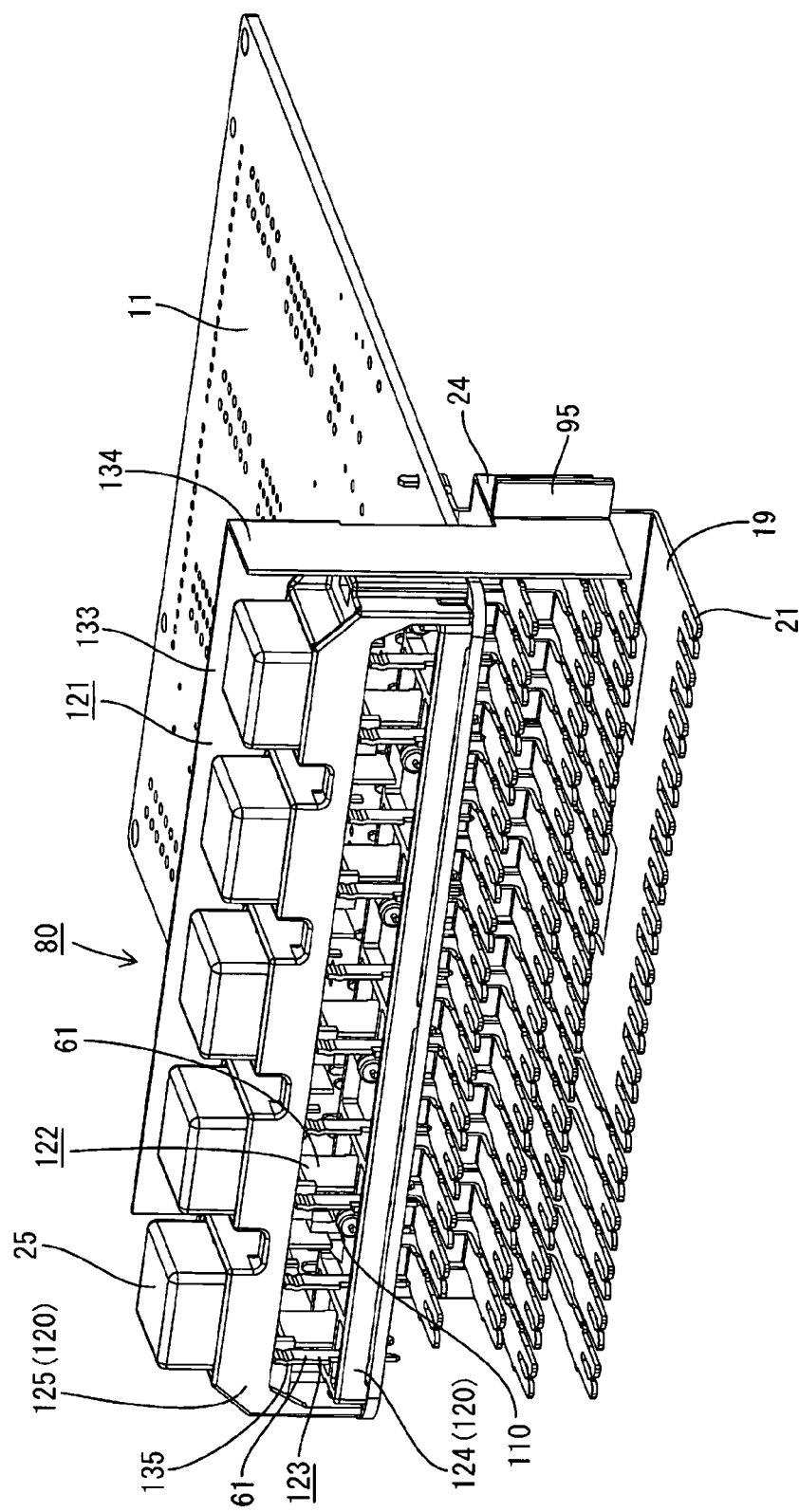
FIG. 22 is an enlarged perspective view showing an essential part of a connection structure between a circuit board and the relay unit.

The relay unit 80 is constructed by assembling a metal bus bar 121, the relays 25, third connection fittings 122, and fourth connection fittings 123 to a frame 120 of a synthetic resin. As shown in FIG. 21, the frame 120 is constructed by combining a first frame 124 with a second frame 125 together.

The first frame 124, positioned on the lower side of FIG. 21, is shaped like a plate and has slits 126 in which the third connection fittings 122 and the fourth connection fittings 123 are fitted. The first frame has lock projections 127 arranged at respective outer edges thereof and projecting outward. The lock projections 127 engage respective engaging locks 128 on the second frame 125 described below to combine the first and second frames together.

The second frame 125, positioned on the upper side of FIG. 21, comprises a lattice-like relay mounting portion 130 including relay mounting windows 129 in which the respective relays 25 are mounted, and legs 131 hanging downward from the relay mounting portion 130 in FIG. 21. The relay mounting portion 130 has receivers 132 each projecting inward of the corresponding relay mounting window 129. The receiver 132 engages the corresponding relay 25 when the relay 25 is mounted in the relay mounting window 129. This prevents the relay 25 from being displaced downward in FIG. 21. The engaging lock 128 is formed on the leg 131.

The bus bar 121 is generally L-shaped and extends from a right and front side to a left and rear side in FIG. 21. The bus bar 121 comprises an assembly portion 133 assembled to the second frame 125 and an extending portion 134 extending downward from the assembly portion 133. The assembly portion 133 has the relay connections 93, bent leftward and frontward in FIG. 21 and connected to the lead terminals 89 of the respective relays 25.

The third connection fitting 122 is made by pressing a metal plate into a predetermined shape. A relay connection 135 is provided at a lower edge of the third connection fitting 122 in FIG. 21. A welding protrusion 137 is provided on the relay connection 135. The welding protrusion 137 is welded to the lead terminals 89 on the corresponding relay 25 by a well-known technique. The third connection fitting 122 has an engaging protrusion 136 provided at a lower end thereof and protruding rightward and rearward in FIG. 21. When the third connection fitting 122 is inserted into the corresponding slit 126 in the first frame 124, the engaging protrusion 136 engages an edge of the slit 126 to prevent the third connection fitting 122 from being displaced downward in FIG. 21.

The tab 82, inserted through the corresponding through-hole 81 in the circuit board 11 and soldered to the conductive path on the circuit board 11, is formed at the lower edge of the corresponding third connection fitting 122 so as to project downward.

The fourth connection fitting 123 is made by pressing a metal plate into a predetermined shape. The relay connection 135 is provided at an upper edge of the fourth connection fitting 123 in FIG. 21. A welding protrusion 138 is provided on the relay connection 135. The welding protrusion 138 is welded to the lead terminals 89 on the corresponding relay 25 by a well-known technique. The fourth connection fitting 123 has an engaging protrusion 139 provided at a lower end thereof and protruding rightward and rearward in FIG. 21. When the fourth connection fitting 123 is inserted into the corresponding slit 126 in the first frame 124, the engaging protrusion 139 engages an edge of the slit 126 to prevent the fourth connection fitting 123 from being displaced downward in FIG. 21.

The tab 82, inserted through the corresponding through-hole 81 in the circuit board 11 and soldered to the conductive path on the circuit board 11, is formed at the lower edge of the corresponding fourth connection fitting 123 so as to project downward.

Figure 23:
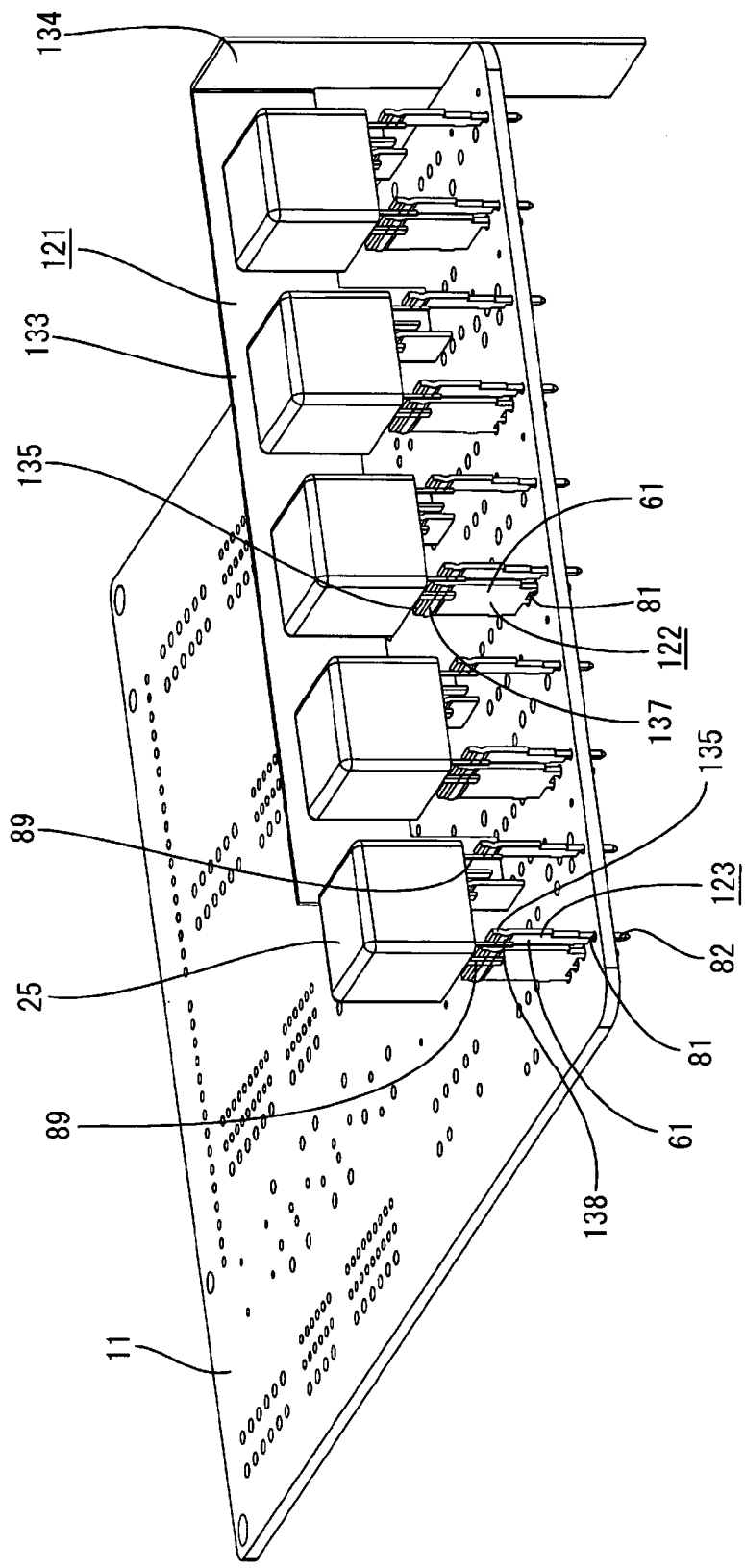
FIG. 23 is an enlarged perspective view showing an essential part of a connection structure between the circuit board and each of a third connection fitting and a fourth connection fitting.

As shown in FIG. 23, the plurality of third connection fittings 122 and the plurality of fourth connection fittings 123 are arranged at intervals in juxtaposition so as to extend away from the plate surface of the circuit board 11. As described above, the relay connection 135 is formed at the upper end of each of the third and fourth connection fittings 122 and 123 in FIG. 23 and connected to the lead terminals 89 of the corresponding relay 25. On the other hand, the tab 82 is formed at the lower end of each of the third and fourth connection fittings 122 and 123 in FIG. 23 and inserted through and soldered to the corresponding through-hole 81 in the circuit board 11.

Figure 19:
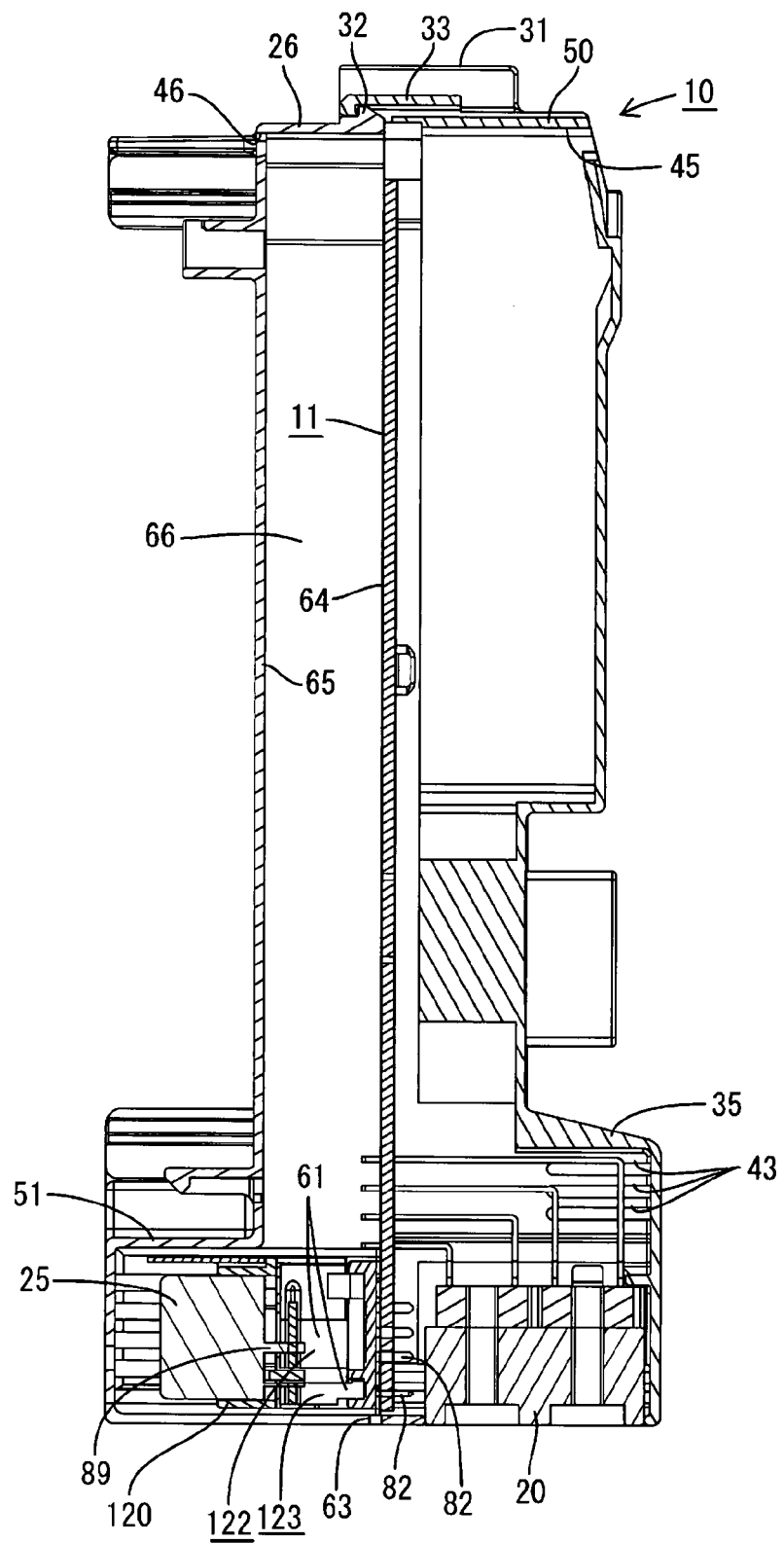
FIG. 19 is a sectional view of an electric connection box in accordance with Illustrative Aspect 4 of the present invention.
Figure 20:
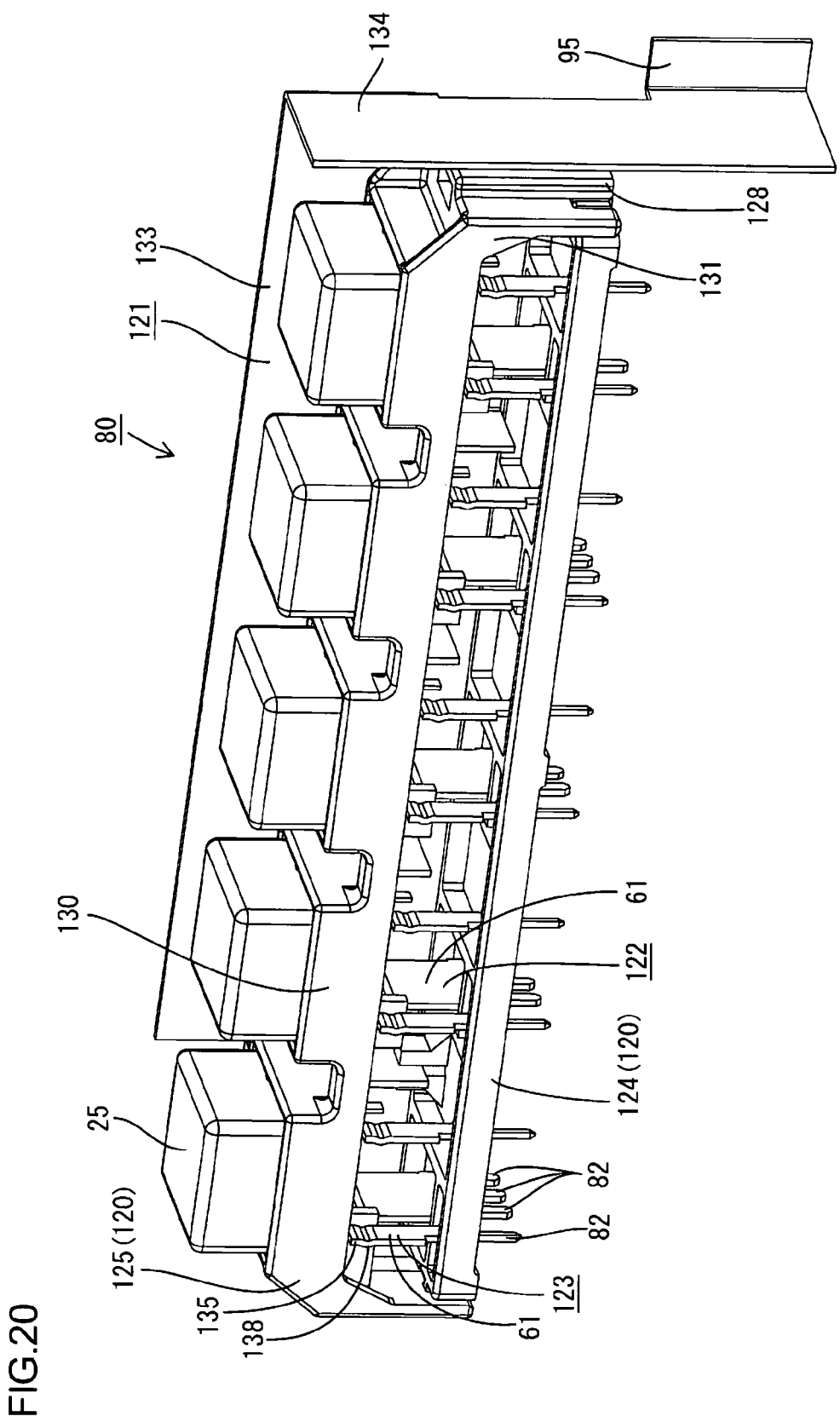
FIG. 20 is an enlarged perspective view showing an essential part of a relay unit.

As shown in FIG. 19, the area of each of the third and fourth connection fittings 122 and 123 which is positioned in the ventilation path 66 constitutes the cooled portion 61. Each of the relays 25 is disposed on the corresponding cooled portion 61 with the bottom thereof located opposite the circuit board 11. That is, the bottom of the relay 25 is exposed to the ventilation path 66.

The insulating film (not shown) is formed on the entirety of each of the third and fourth connection fittings 122 and 123 and the bus bar 121 except for the connection thereof to the corresponding relay 25. This makes it possible to prevent possible short-circuiting even if dust enters the case 10 and contacts the adjacent third or fourth connection fittings 122 or 123 so as to spread across the third or fourth connection fittings 122 or 123.

The remaining part of the configuration is the same as to that in Illustrative Aspect 3. Thus, the same components are denoted by the same reference numerals, and the description thereof is omitted to avoid duplication.

According to the present illustrative aspect, the bottom of each of the relays 25 is exposed to the ventilation path 66 and can thus be efficiently cooled.

<Other Illustrative Aspects>

The present invention is not limited to the illustrative aspects described on the basis of the above description and the drawings. For example, the illustrative aspects described below are also included in the technical scope of the present invention.

(1) In the present illustrative aspect, the circuit board 11 is accommodated in the case 10 in a vertical position. However, the circuit board 11 may be accommodated in the case 10 in a horizontal position. That is, the circuit board 11 may be accommodated in the case 10 in any position.

(2) In the present illustrative aspect, the heat generating component is the relay 25. However, the heat generating component may be a semiconductor relay or a fuse. Any component may be used provided that the component generates heat when energized. Furthermore, the heat generating component has only to be positioned inside the ventilation path and need not be located at the bottom of the ventilation path.

(3) In the present illustrative example, the main body and cover exhaust ports 45 and 46 are formed in the side wall of the case main body 50 and the side wall of the cover 26, respectively. However, the exhaust ports may be provided in the top surface of the case 10 if the electric connection box is installed in a place in which water droplets fall from above. Furthermore, for example, a canopy top may be provided above the exhaust ports to prevent water droplets from falling from above.

(4) In the present illustrative aspect, the open area of the main body and cover exhaust ports 45 and 46 is set larger than that of the ventilation port 43 and the opening 23. However, the present invention is not limited to this. The opening area of the main body and cover exhaust ports 45 and 46 is set equal to or smaller than that of the ventilation port 43 and the opening 23.

(5) A cover may be provided behind the main body and cover exhaust ports 45 and 46 in an exhaust direction to prevent water droplets and dust falling from the top of the case 10 from entering the case 10 through both exhaust ports.

(6) An insulating plate may be stuck to the cooled portions 61 and has a large number of ventilation holes formed in areas in which the bus bars 24 are not stuck to the insulation plate so that air can flow between the bus bars 24.

(7) In the present illustrative aspect, the side suction ports are formed in the side wall of the cover 26, and the bottom suction ports 63 are formed in the bottom wall of the cover 26. However, the present invention is not limited to this. The suction ports may be formed in the bottom wall or side wall of the cover 26. The suction ports may be formed at any positions on the case 10 provided that the suction ports are continuous with the ventilation path 66 and that air can flow in the vertical direction between the bus bars 24 of the cooled portions 61.

(8) A cover may be provided behind the main body and cover exhaust ports 45 and 46 in an exhaust direction to prevent water droplets and dust falling from the top of the case 10 from entering the case 10 through both exhaust ports.

(9) In the present illustrative aspect, the relays 25 are connected to the respective bus bars 24 with the bottom thereof located on the lower side. However, the present invention is not limited to this. The relays may be connected to the respective bus bar in any position provided that the relays are positioned in the ventilation path.

(10) In the present illustrative aspect, the bus bars or the connection members are used as the conductive members. However, the present invention is not limited to this. Electric wires may be used as the conductive members and may have the cooled portions.

(11) In Illustrative Aspect 4, the relays are separate from the conductive members (connection members). However, the present invention is not limited to this. The conductive members may be formed by extending the lead terminals of the relays.

What is claimed is:

1. An electric connection box comprising:
a circuit board;
a plurality of conductive members on the circuit board juxtaposing and extending away from the circuit board;
a case accommodating the circuit board;
a ventilation path which is formed in the case and through which air can flow in a vertical direction;
a suction port formed in the case to be in communication with the ventilation path;
an exhaust port formed in the case to be in communication with the ventilation path, the exhaust port positioned above the suction port;
cooled portions positioned on the plurality of conductive members and positioned in the ventilation path so as to allow air to flow in the vertical direction between the plurality of conductive members; and
heat generating components connected to the cooled portions of the conductive members.

2. The electric connection box according to claim 1, wherein an insulation film is formed on the entirety of each of the conductive members except on a connection thereof to the heat generating component.

3. The electric connection box according to claim 2, wherein the conductive member is a bus bar extending from an edge of the circuit board.

4. The electric connection box according to claim 3, wherein the suction port is formed in a bottom wall of the case.

5. The electric connection box according to claim 4, wherein each of the heat generating components is a relay, and the relay is disposed on the corresponding cooled position, further wherein the relay has a bottom thereof positioned on a lower side of the case.

6. The electric connection box according to claim 5, wherein the ventilation path is positioned so that when the circuit board is in a vertical position, air is allowed to flow in the vertical direction between a plate surface of the circuit board and an opposite inner wall surface of the case.

7. The electric connection box according to claim 6, wherein the heat generating component is disposed at an inner bottom of the case.

8. The electric connection box according to claim 7, wherein an electronic component is capable of being mounted on a first surface of the circuit board, further wherein a second surface of the circuit board defines a non-mounting surface, and the ventilation path is formed so that when the non-mounting surface of the circuit board is located opposite the inner wall surface of the case, air is able to flow between the non-mounting surface of the circuit board and the inner wall surface of the case.

9. The electric connection box according to claim 7, wherein the ventilation path is positioned so that when a plurality of fitting recesses via which electric components are externally fitted into a side wall of the case located opposite the plate surface of the circuit board are depressed toward the circuit board and arranged at intervals in juxtaposition in a horizontal direction, air is able to flow between the fitting recesses.

10. The electric connection box according to claim 2, wherein the conductive member is a connector fitting positioned to extend away from the plate surface of the circuit board, one end of the connection fitting being soldered to the circuit board, the other end of the connection fitting being connected to the heat generating component.

11. The electric connection box according to claim 10, wherein the suction port is formed in a bottom wall of the case.

12. The electric connection box according to claim 11, wherein each of the heat generating components is a relay, and the relay is disposed on a cooled position and having a bottom positioned on a lower side.

13. The electric connection box according to claim 12, wherein the ventilation path is positioned so that when the circuit board is placed in the case in a vertical position, air is allowed to flow in the vertical direction between a plate surface of the circuit board and an opposite inner wall surface of the case.

14. The electric connection box according to claim 13, wherein the heat generating component is disposed at an inner bottom of the case.

15. The electric connection box according to claim 14, wherein an electronic component is mounted on a first surface of the circuit board, the second surface of the circuit board defines a non-mounting surface, and the ventilation path is formed so that when the non-mounting surface of the circuit board is located opposite the inner wall surface of the case, air is allowed to flow between the non-mounting surface of the circuit board and the inner wall surface of the case.

16. The electric connection box according to claim 14, wherein the ventilation path is positioned so that when a plurality of fitting recesses via which electric components are externally fitted into a side wall of the case located opposite the plate surface of the circuit board are depressed toward the circuit board and arranged at intervals in juxtaposition in a horizontal direction, air is able to flow between the fitting recesses.

17. The electric connection box according to claim 1, wherein an opening area of the exhaust port is larger than an opening area of the suction port.

18. The electric connection box according to claim 1, wherein the exhaust port is positioned in a side wall of the case to open in a horizontal direction.

* * * * *